(12) United States Patent
Ban et al.

(10) Patent No.: US 10,892,534 B2
(45) Date of Patent: Jan. 12, 2021

(54) NON-RECIPROCAL CIRCUIT OF SMD TYPE AND ALIGNING FRAME FOR THE SAME

(71) Applicant: 3RWAVE CO. LTD., Gyeonggi-do (KR)

(72) Inventors: Yong Ju Ban, Seoul (KR); Dong Hwi Lee, Gyeonggi-do (KR); Hee Suk Goh, Gyeonggi-do (KR)

(73) Assignee: 3RWAVE CO. LTD., Gyeonggi-do (KR)

( * ) Notice: Subject to any disclaimer, the term of this patent is extended or adjusted under 35 U.S.C. 154(b) by 0 days.

(21) Appl. No.: 16/427,721

(22) Filed: May 31, 2019

(65) Prior Publication Data

US 2019/0372191 A1 Dec. 5, 2019

(51) Int. Cl.
| | | |
|---|---|---|
| *H01P 1/387* | (2006.01) | |
| *H01P 1/36* | (2006.01) | |
| *H01P 1/38* | (2006.01) | |
| *H05K 7/18* | (2006.01) | |

(52) U.S. Cl.
CPC .................. *H01P 1/36* (2013.01); *H01P 1/38* (2013.01); *H01P 1/387* (2013.01); *H05K 7/18* (2013.01)

(58) Field of Classification Search
CPC .... H01P 1/387; H01P 1/38; H01P 1/36; H01P 1/383
USPC .................................................. 333/1.1, 24.2
See application file for complete search history.

(56) References Cited

U.S. PATENT DOCUMENTS

| | | | |
|---|---|---|---|
| 6,011,449 A | 1/2000 | Jussaume | |
| 6,566,972 B2 | 5/2003 | Paquette | |
| 6,955,553 B2* | 10/2005 | Watanabe | H01P 1/36 333/1.1 |
| 2002/0190808 A1* | 12/2002 | Paquette | H01P 1/32 333/1.1 |
| 2006/0261910 A1* | 11/2006 | Kingston | H01P 1/387 333/24.2 |
| 2007/0182504 A1* | 8/2007 | Mukai | H01P 1/387 333/1.1 |
| 2009/0243746 A1* | 10/2009 | Kocharyan | H01P 1/383 333/1.1 |
| 2016/0254581 A1* | 9/2016 | Sasaki | H01P 1/387 333/1.1 |

FOREIGN PATENT DOCUMENTS

KR   1020140059954   5/2014

* cited by examiner

*Primary Examiner* — Stephen E. Jones
(74) *Attorney, Agent, or Firm* — Stuart H. Mayer; Mayer & Williams PC

(57) ABSTRACT

A reciprocal element includes a housing having a plurality of circumferential side portions with a plurality of openings and a bottom portion in which at least one removed portion is defined. A first lamination part includes a center conductor with a plurality of leads extending to the outside of the plurality of openings, respectively, wherein the first lamination part is laminated on the bottom portion. A frame includes a main body to accommodate the first lamination part, at least one leg portion extending from a lower edge of the main body and insertedly coupled to the removed portion, and a plurality of supporting portions extending in an outer direction from the main body to support the plurality of leads, wherein through-holes extend in a vertical direction and defined in the plurality of supporting portions, respectively; and a plurality of conductive pins coupled to the plurality of through-holes, respectively.

12 Claims, 24 Drawing Sheets

NON-RECIPROCAL CIRCUIT OF SMD TYPE AND ALIGNING FRAME FOR THE SAME

CROSS-REFERENCE TO RELATED APPLICATIONS

This U.S. non-provisional patent application claims priority under 35 U.S.C. § 119 of Korean Patent Application No. 10-2018-0063717, filed on Jun. 1, 2018, and Korean Patent Application No. 10-2018-0073480, filed on Jun. 26, 2018, the entire contents of which are hereby incorporated by reference.

BACKGROUND

The present invention relates to a high-frequency component, and more particularly, to a SMD-type non-reciprocal element.

In general, a non-reciprocal circuit element such as a circulator and an isolator is a high-frequency communication component that is designed so that a signal inputted through a predetermined port rotates in one direction along Faraday rotation and is transmitted to another predetermined port.

The circulator is generally designed to have three ports so that a signal inputted from each of the ports has the same coefficient of transmission and the same coefficient of reflection, and is transmitted to another port adjacent thereto. Thus, each of the ports may be an input port as well as an output port having directivity with respect to an adjacent port. FIG. 1 illustrates a general symbol of the circulator.

The isolator is designed to have three ports so that one of the three ports is connected to a termination, and each of the ports serves only one role. That is, a signal inputted through an input port is transmitted through an output port, and, on the contrary, a signal inputted through the output port is transmitted to a termination port, which is connected to a termination, and then extinct. Thus, in case of an ideal isolator, a signal inputted from the output port is blocked without being transmitted to the input port.

In general, the isolator and the circulator are disposed between a power amplifier and an antenna in a sending end of a wireless communication device, and allow a signal amplified from the power amplifier to be transmitted to the antenna with a small loss while blocking a signal reflected by and returned from the antenna or an unwanted signal from being transmitted to the power amplifier.

As demand in wireless communication increases and a communication technology is advanced, demand in communication device has increased, and as price competition is deepened, a surface mounting technology has been widely applied for increasing productivity of the communication device. Also, in case of the non-reciprocal circuit element, demand in surface mounting type product has steadily increased. Thus, a technology for improving a mounting property with low material costs has been steadily progressed.

FIG. 2 is an exploded assembly view illustrating a general surface mounting type circulator disclosed in Korean Patent Publication No. KR 10-2014-0059954. A center conductor 141 and two microwave ferrites 145 and 146, which constitute a resonator, are laminated in a housing 148, which is made of a soft magnetic material, together with a permanent magnet 143 and a pole piece 144 and 147, and a lid 142 made of a soft magnetic material is also laminated thereon to compress and fix the laminated and inserted internal elements. The center conductor 141 may include three leads 141a, 141b, and 141c that are substantially spaced at 120° C.

FIG. 3 is a side view illustrating a general surface mounting type circulator disclosed in Korean Patent Publication No. KR 10-2014-0059954. The leads of the center conductor 141, which protrude to the outside of the housing through three openings that are substantially spaced at 120° C. from a side surface of the housing 148, are bent to have the same height as a bottom surface of the housing so that the leads are connected and soldered to an electrode on a printed circuit board of a system to which the circulator is mounted. As illustrated in FIG. 3, although the above-described surface mounting structure is commercialized and substantially being used, various technical limitations have been revealed. The bent three leads 141a, 141b, and 141c of the center conductor may be easily deformed in shape even by a small external impact during a process of being mounted on the printed circuit board of the system or a process of manufacturing a product, and this may be a cause of high process failure.

Thus, to resolve the above-described limitation, patent applications such as U.S. Pat. No. 6,011,449 having a representative figure as in FIG. 4 have been filed. In case of U.S. Pat. No. 6,011,449, a supporting plate extends from the housing, a transmission line provided on the center conductor is fixed to the supporting plate, and the transmission line is connected to a transmission line on a main board (not shown) through a metal pin that is insulated by using an insulator. However, the above-described method requires a precise processing technology for allowing an input/output metal pin to have the same flatness as a bottom surface of the housing.

As another method, patent applications such as U.S. Pat. No. 6,566,972 having a representative figure as in FIG. 5 have been filed. In the above patent, a non-conductive aligning frame, which aligns elements in the housing, extends to the outside of the housing, and the metal pin is inserted to each end of the extended frame. Since the above-described structure may simplify a structure of the housing, and the non-conductive aligning frame may serve as a supporting plate, reduction in manufacturing costs of the non-reciprocal circuit element may be anticipated. However, in general, an aligning frame manufactured by using a plastic injection technology is mechanically weaker than that made of metal. In case of U.S. Pat. No. 6,566,972, since the supporting plate floats from the ground as many as a thickness of the bottom surface of the housing, the aligning frame is vulnerable to especially forces applied from the outside. Also, in a completely assembled state, a position of the aligning frame may be fixed to left and right sides through an opened opening surface of the housing, but the position may be hardly fixed to top and bottom sides. Thus, the position may be slightly moved in a vertical direction. Here, the metal pin fixed to the aligning frame may be also moved together with the aligning frame in the vertical direction.

SUMMARY

The present invention is to provide a non-reciprocal element having a highly reliable structure capable of being mounted in SMD-type and an aligning frame for the same.

According to one aspect of the present invention, a reciprocal element can be provided. The reciprocal element comprises a housing (600) comprising a plurality of circumferential side portions (641, 642, 643), which are distinguished by a plurality of openings (621, 622, 623), and a bottom portion (610) in which at least one removed portion (631) is defined; a first lamination part (20) comprising a center conductor (200) comprising a plurality of leads (201, 202, 203) extending to the outside of the plurality of openings, respectively, wherein the first lamination part (20) is laminated on the bottom portion; a frame (100) comprising a main body (110) configured to accommodate the first lamination part, at least one leg portion (131) extending from a lower edge of the main body (110) and insertedly coupled to the at least one removed portion, and a plurality of supporting portions (111, 112, 113) extending in an outer direction from the main body in order to support the plurality of leads, wherein through-holes (121, 122, 123) extending in a vertical direction and defined in the plurality of supporting portions, respectively; and a plurality of conductive pins (51, 52, 53) coupled to the plurality of through-holes, respectively.

At this time, a lower end of each of the plurality of conductive pins and a bottom surface of the bottom portion may be substantially disposed on a first plane.

At this time, an internal element disposed at an uppermost portion of the first lamination part may have an upper side, in which a portion protrudes upward from an upper edge of the frame, and a lower side, in which a portion downward from an upper edge of the frame is accommodated by the frame.

At this time, each of the plurality of supporting portion may comprise: a left reinforcement portion extending in a vertical direction and disposed at a left side of the supporting portion; and a right reinforcement portion extending in a vertical direction and disposed at a right side of the supporting portion, and in each of the plurality of supporting portions, the supporting portion, the left reinforcement portion, and the right reinforcement portion have a H-beam shaped structure.

At this time, a lower end of each of the plurality of conductive pins and a bottom surface of the bottom portion may be disposed on a first plane, and the left reinforcement portion and the right reinforcement portion may be substantially disposed on the first plane.

At this time, a lower end of each of the plurality of conductive pins and a bottom surface of the bottom portion may be substantially disposed on a first plane, a bottom surface of the leg portion may be substantially disposed on the first plane, a thickness between the bottom and top surfaces of the leg portion may be the same as that of the bottom portion, and a bottom surface of the first lamination part may contact all of a top surface of the bottom portion and a top surface of the leg portion.

According to another aspect of the present invention, a frame for a reciprocal element can be provided. The frame comprises: a housing (600) comprising a plurality of circumferential side portions (641, 642, 643), which are distinguished by a plurality of openings (621, 622, 623), and a bottom portion (610) in which at least one removed portion (631) is defined; and a first lamination part (20) comprising a center conductor (200) comprising a plurality of leads (201, 202, 203) extending to the outside of the plurality of openings, respectively, wherein the first lamination part (20) is laminated on the bottom portion, the frame comprising: a main body (110) configured to accommodate the first lamination part; at least one leg portion (131) extending from a lower edge of the main body (110) and insertedly coupled to the at least one removed portion; and a plurality of supporting portions (111, 112, 113) extending outward from the main body in order to support the plurality of leads, wherein through-holes (121, 122, 123) extending in a vertical direction are defined in the plurality of supporting portions, respectively, and a plurality of conductive pins (51, 52, 53) are insertedly coupled to the through-holes, respectively.

At this time, the frame may have a dimension such that a lower end of each of the plurality of conductive pins and a bottom surface of the bottom portion are substantially disposed on a first plane.

At this time, the frame may have a dimension such that an internal element disposed at an uppermost portion of the first lamination part has an upper side, in which a portion protrudes upward from an upper edge of the frame, and a lower side, in which a portion downward from an upper edge of the frame is accommodated by the frame.

At this time, each of the plurality of supporting portion may comprise: a left reinforcement portion extending in a vertical direction and disposed at a left side of the supporting portion; and a right reinforcement portion extending in a vertical direction and disposed at a right side of the supporting portion, and in each of the plurality of supporting portions, the supporting portion, the left reinforcement portion, and the right reinforcement portion have a H-beam shaped structure.

At this time, the frame may have a dimension such that a lower end of each of the plurality of conductive pins and a bottom surface of the bottom portion are disposed on a first plane, and the left reinforcement portion and the right reinforcement portion are substantially disposed on the first plane.

At this time, a lower end of each of the plurality of conductive pins and a bottom surface of the bottom portion may be substantially disposed on a first plane, a bottom surface of the leg portion may be substantially disposed on the first plane, a thickness between the bottom and top surfaces of the leg portion may be the same as that of the bottom portion, and a bottom surface of the first lamination part may contact all of a top surface of the bottom portion and a top surface of the leg portion.

According to the present invention, a non-reciprocal element having a highly reliable structure capable of being mounted in SMD-type and an aligning frame for the same can be provided.

DETAILED DESCRIPTION

Hereinafter, embodiments of the present invention will be described with reference to the accompanying drawings. However, the present invention is not limited to the embodiments described herein, but may be implemented in various other forms. The terminology used herein is for the purpose of understanding the embodiments and is not intended to limit the scope of the present invention. In addition, the singular forms used below include plural forms unless the phrases expressly have the opposite meaning.

Figure 1:
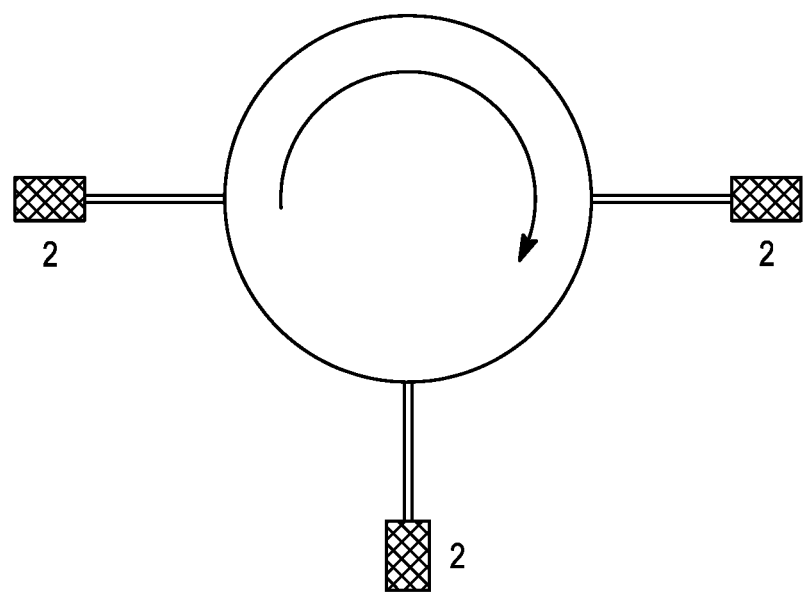
FIG. 1 illustrates a general symbol of the circulator.
Figure 2:
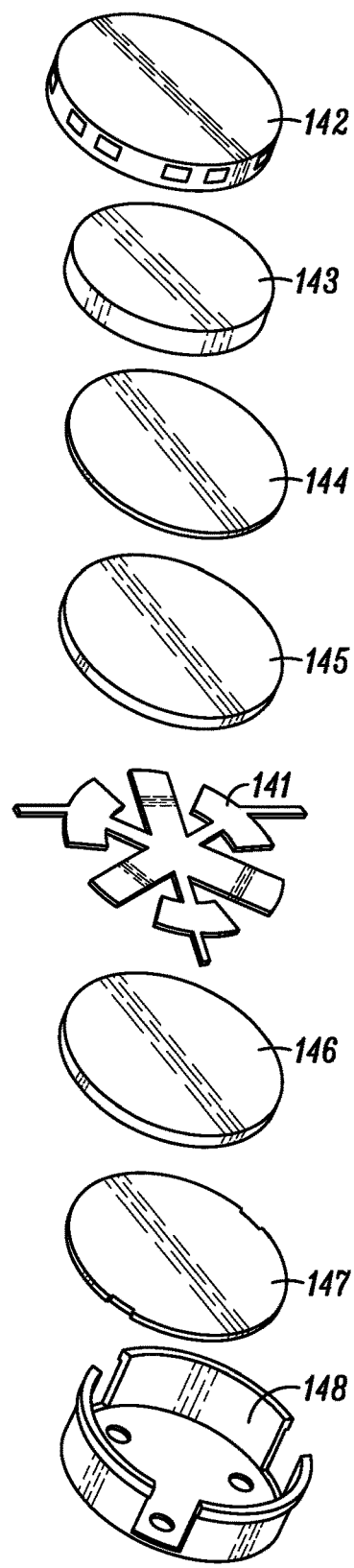
FIG. 2 is an exploded assembly view illustrating a general surface mounting type circulator disclosed in Korean Patent Publication No. KR 10-2014-0059954.
Figure 3:
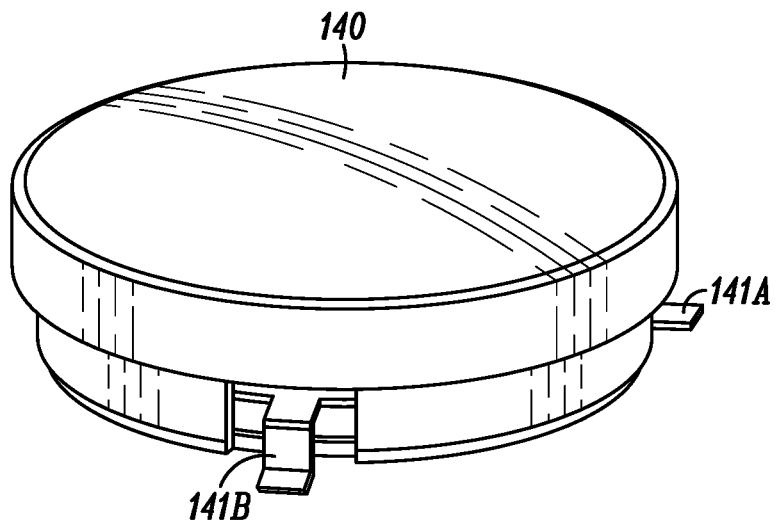
FIG. 3 is a side view illustrating a general surface mounting type circulator disclosed in Korean Patent Publication No. KR 10-2014-0059954.
Figure 4:
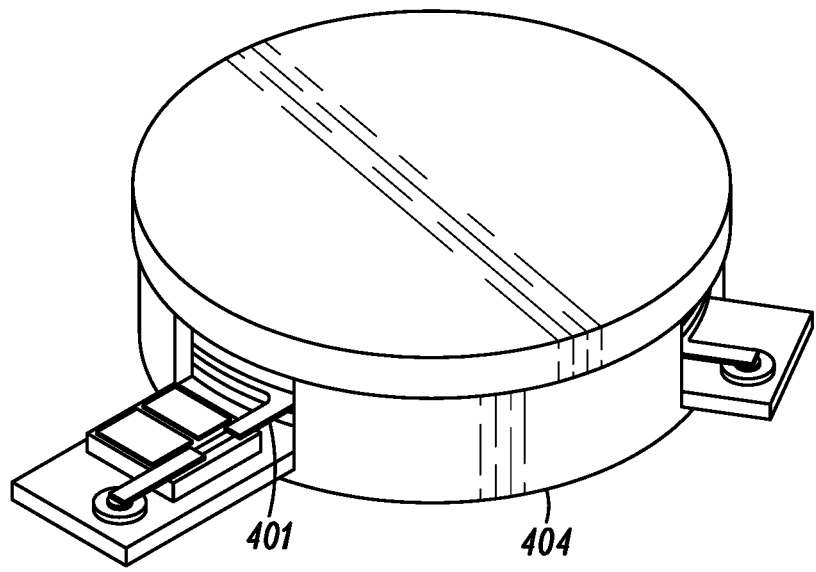
FIG. 4 is the representative figure of U.S. Pat. No. 6,011,449.
Figure 5:
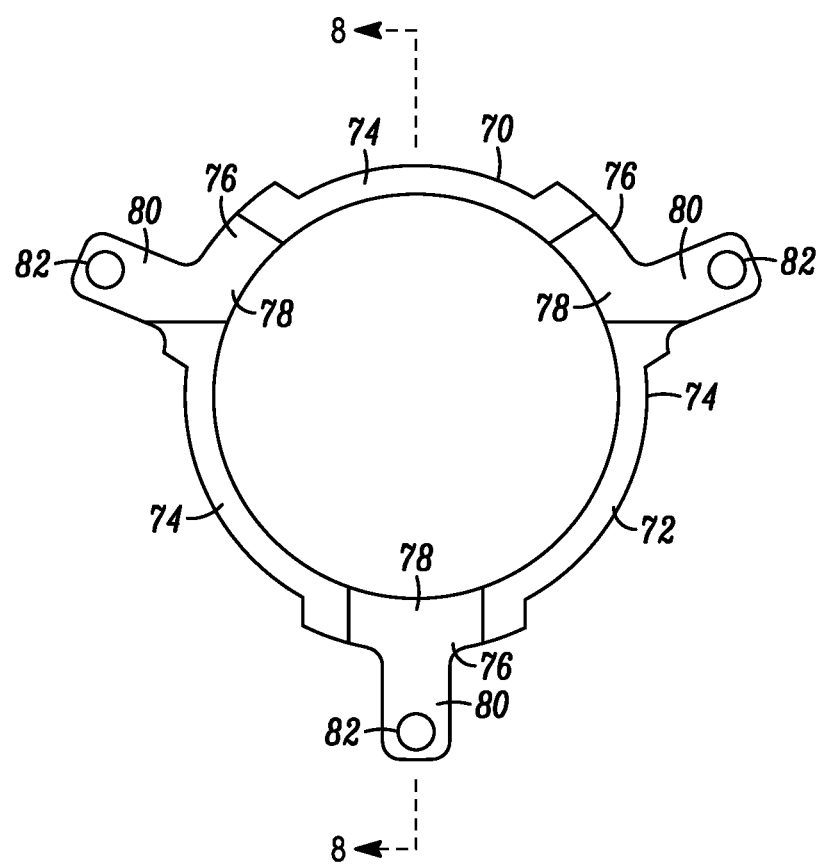
FIG. 5 is the representative figure of U.S. Pat. No. 6,566,972.
Figure 6:
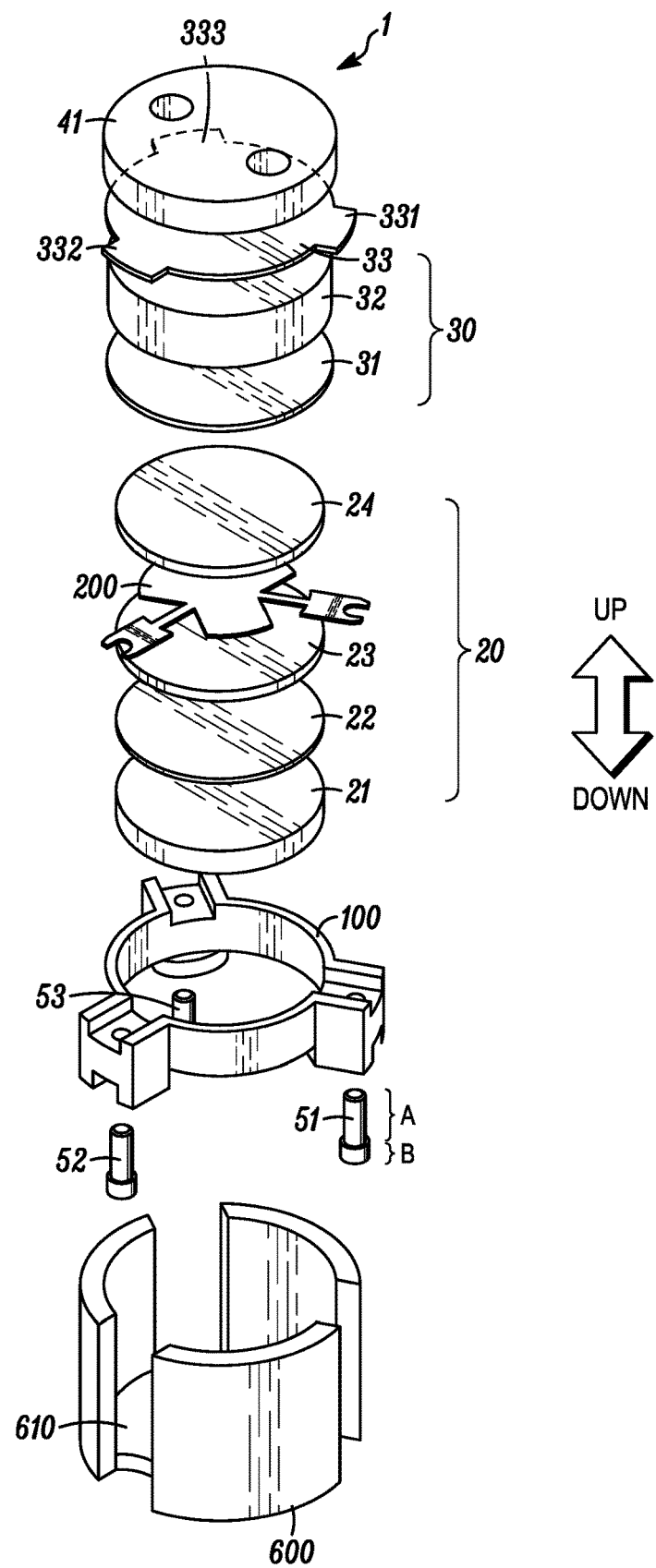
FIG. 6 is a view illustrating a structure a structure of a passive microwave device according to an embodiment of the present invention.

FIG. 6 is a view illustrating a structure a structure of a passive microwave device 1 according to an embodiment of the present invention.

Hereinafter, in this specification, for convenience of description, an upward direction and a downward direction are defined as illustrated by arrows in FIG. 6.

The passive microwave device 1 according to an embodiment of the present invention may be, e.g., a passive ferrite isolator, a passive ferrite circulator, an isolator, or a circulator. In this specification, the passive microwave device may be referred to as a non-reciprocal circuit element.

The passive microwave device 1 may include a housing 600.

A lower permanent magnet 21, a lower pole piece 22, a lower microwave ferrite 23, a center conductor 200, an upper microwave ferrite 24, an upper pole piece 31, an upper permanent magnet 32, a stopper 33, and a lid 41 may be sequentially laminated on a bottom portion 610 of the housing 600.

In this specification, each of the lower permanent magnet 21, the lower pole piece 22, the lower microwave ferrite 23, the center conductor 200, the upper microwave ferrite 24, the upper pole piece 31, the upper permanent magnet 32, and the stopper 33 may be referred to as an internal element. Each of the above-described internal elements may has a disc shape or a shape deformed from a disc. Each of the internal elements may have different thicknesses from each other.

In an embodiment of the present invention, a lamination structure including the lower permanent magnet 21, the lower pole piece 22, the lower microwave ferrite 23, the center conductor 200, and the upper microwave ferrite 24 may be referred to as a first lamination part 20. In an embodiment of the present invention, a lamination structure including the upper pole piece 31, the upper permanent magnet 32, and the stopper 33 may be referred to as a second lamination part 30.

The lid 41 may compress and fix the internal elements. For example, a screw thread may be provided on an outer circumference surface of the lid 41, and a screw thread may be provided on a side surface of an upper inside of the housing 600. Here, as the lid 41 is screw-coupled to the housing, the first lamination part 20 and the second lamination part 30 may be compressed and fixed to each other.

A frame 100 may be disposed between an inner wall of the housing 600 and an outer edge of the first lamination part 20. All of the first lamination part 20, the second lamination part 30, and the frame 100 may be disposed on the bottom part 610 of the housing 600 and accommodated in a circumferential side portion of the housing 600. Here, a portion of the frame 100 and a portion of the center conductor 200 may protrude and be exposed to the outside of the circumferential side portion of the housing 600. In the present invention, the frame 100 may be referred to as an aligning frame.

Three conductive pins 51, 52, and 53 may be coupled to the frame 100. Each of the conductive pins 51, 52, and 53 includes a through portion A and a head portion B.

The housing 600 may be made of a conductive soft magnetic material, and the lid 41 may be made of a soft magnetic material.

Figure 7:
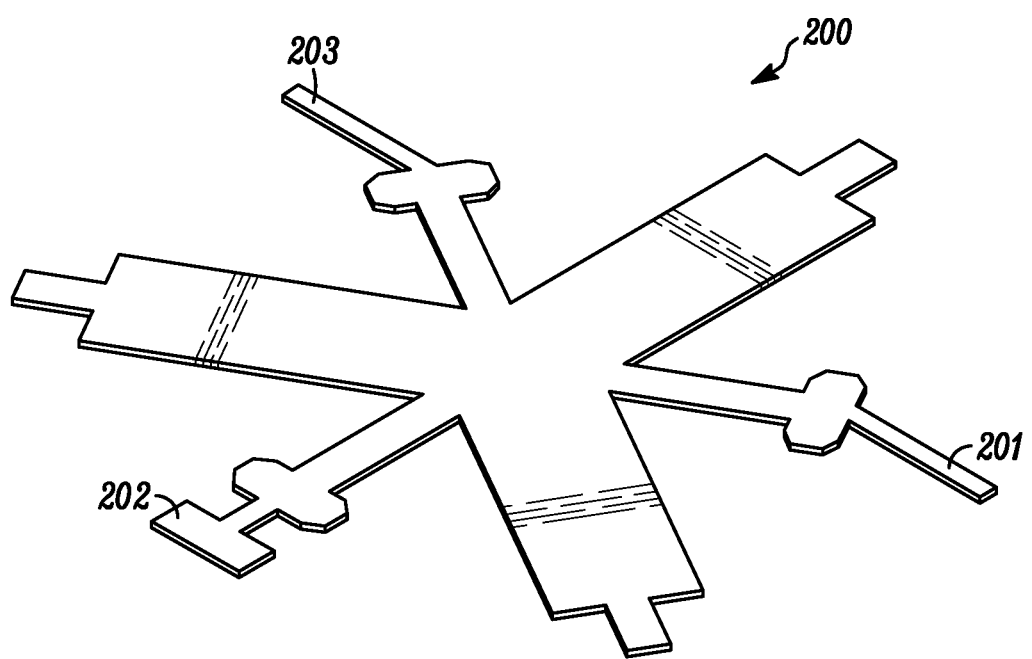
FIG. 7 is a view illustrating a structure of the center conductor in FIG. 6.

FIG. 7 is a view illustrating a structure of the center conductor in FIG. 6.

The center conductor 200 may include a plurality of leads 201, 202, and 204 that are substantially spaced at 120° C.

Figure 8:
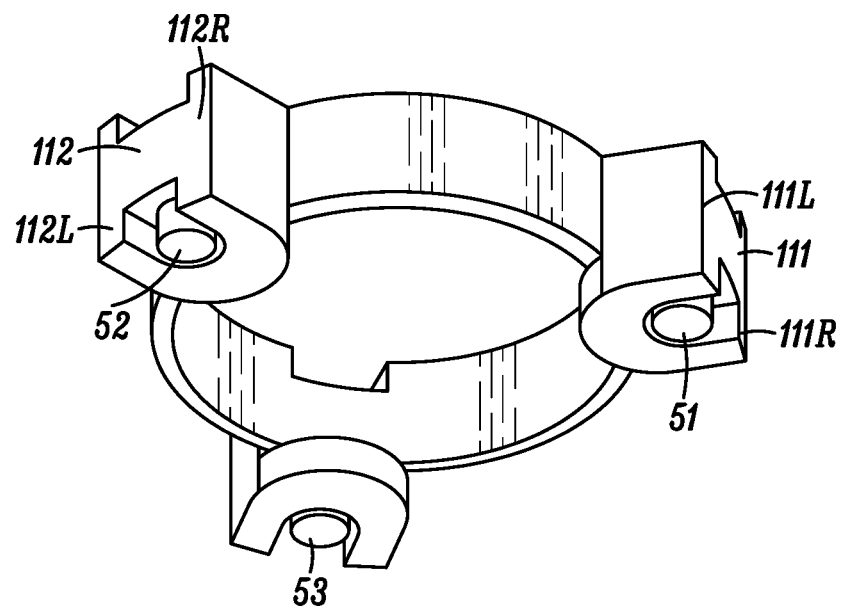
FIGS. 8 and 9 are views illustrating a structure and a coupling relationship of the housing, the frame, and the conductive pin in FIG. 6.
Figure 8:
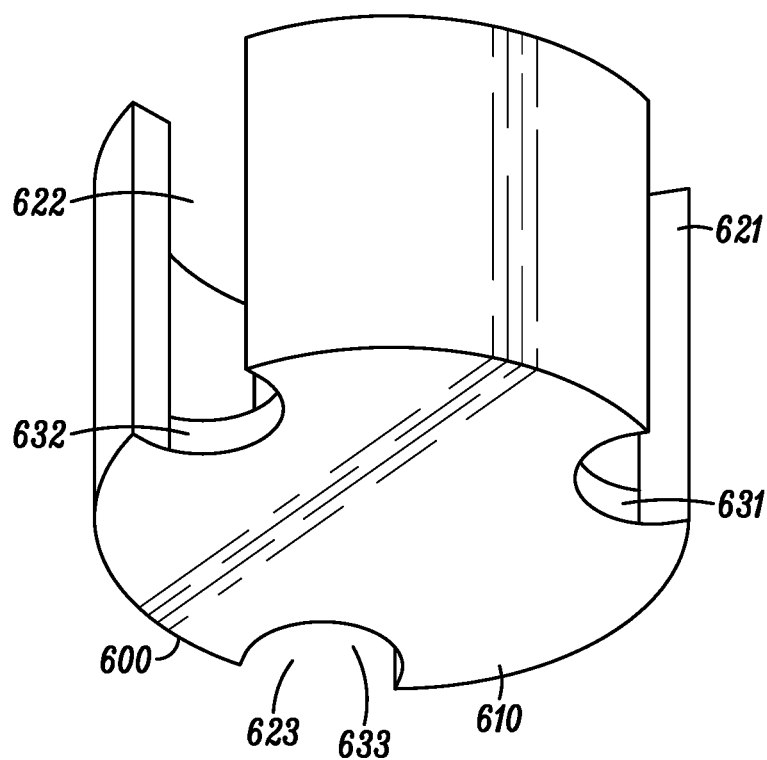
Figure 9:
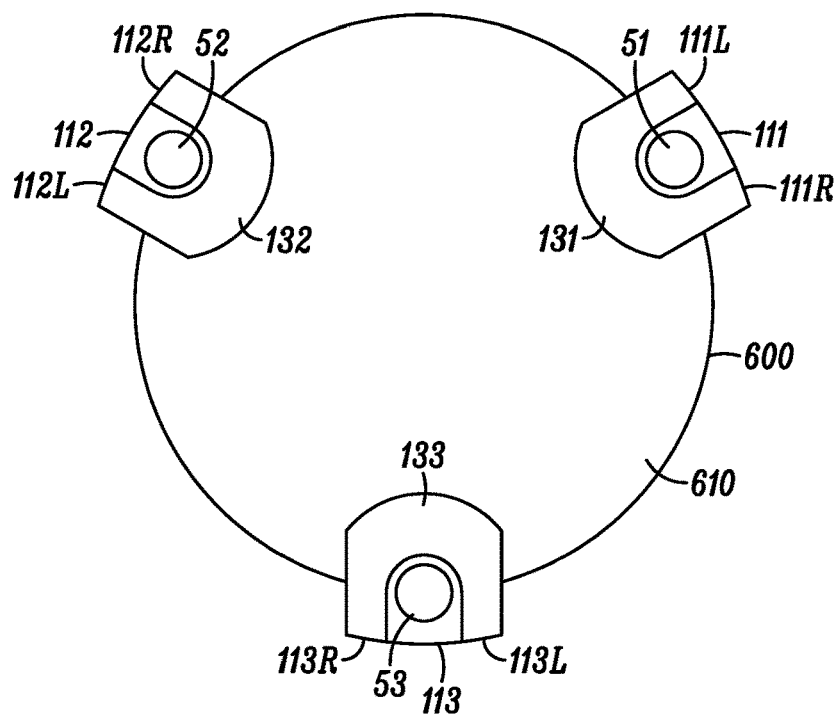

FIGS. 8 and 9 are views illustrating a structure and a coupling relationship of the housing, the frame, and the conductive pin in FIG. 6.

FIG. 8 is a perspective view that is viewed from a side surface at a bottom side with respect to FIG. 6.

FIG. 9 is a bottom view that is viewed from a bottom side with respect to FIG. 6 in a state in which the housing, the frame, and the conductive pin are coupled to each other.

The housing 600 has a shape of a cylindrical structure in which a top portion and other specific portions are removed. The removed other specific portions are indicated by reference numerals 621, 622, 623, 631, 632, and 633 in FIG. 8.

In an embodiment, the housing 600 may not include a top portion. The housing 600 may have a shape that is deformed from a cylindrical structure having a circumferential side portion and a bottom portion. The housing 600 may include a plurality of circumferential side portions 641, 642, and 643, a plurality of openings 621, 622, and 623 that are selectively disposed in the circumferential side portions 641, 642, and 643, and a flat bottom portion 610 connected to lower boundary lines of the circumferential side portions 641, 642, and 643.

In an embodiment, the number of the circumferential side portions and the number of the openings may be the same as that of the leads of the center conductor 200. For example, the number may be three.

The bottom portion 610 may have an overall circular plate shape. Here, a plurality of removed portions 631, 632, and 633, which are recessed toward a center of the bottom portion 610, may be defined in an edge of the bottom portion 610. When the removed portions 631, 632, and 633 are not defined in the bottom portions 610, the bottom portion 610 may have a circular plate shape.

One of the removed portions may be defined at a position corresponding to one of the openings.

The three conductive pins 51, 52, and 53 are inserted and coupled to the frame 100.

Figure 10:
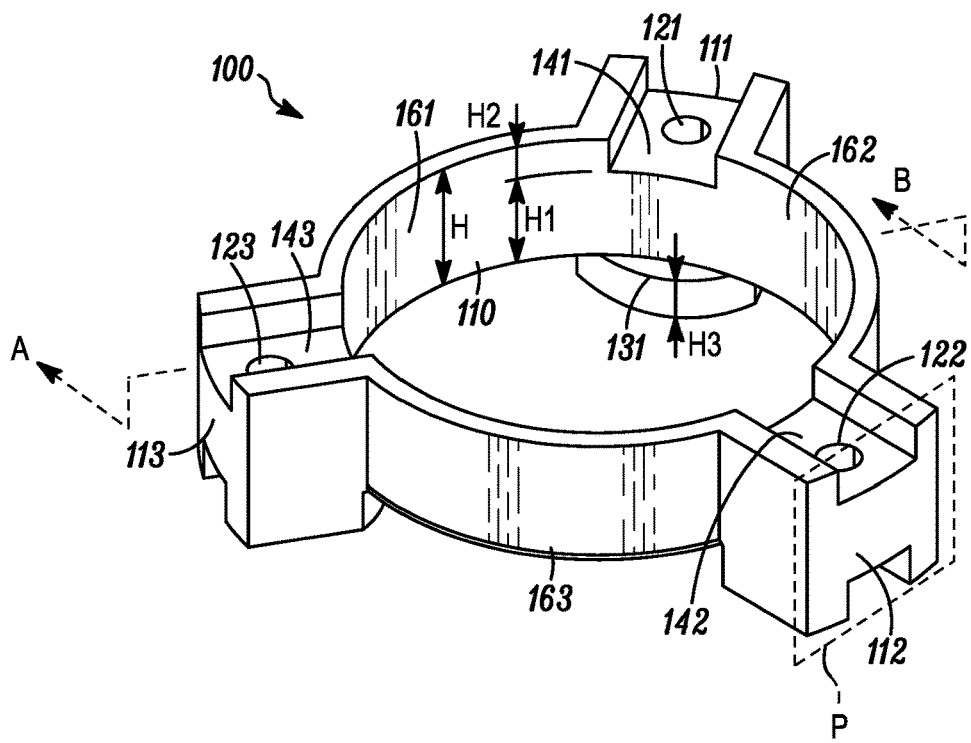
FIG. 10 is a view illustrating a structure of the frame in FIG. 6.

FIG. 10 is a view illustrating a structure of the frame in FIG. 6.

The frame 100 may be made of a non-conductive material. The frame 100 may be made of a synthetic resin material.

The frame 100 may include:

① a ring-shaped body 110;

② a plurality of fence portions 161, 162, and 163 that extend upward from an upper edge of the body 110 while upstanding and are separated from each other by a plurality of accommodation spaces 141, 142, and 143 to accommodate the leads 201, 202, and 203 of the center conductor 200;

③ a plurality of supporting portions 111, 112, and 113 that extend in an outer radial direction from the plurality of accommodation spaces 141, 142, and 143 to support the leads 201, 202, and 204 of the center conductor 200;

④ a plurality of through-holes 121, 122, and 123 that vertically pass through the plurality of plurality of supporting portions 111, 112, and 113, respectively;

⑤ a plurality of leg portions 131, 132, and 133 that protrude while extending from a lower edge of the body 110 in a downward direction and an inner radial direction; and ⑥ a reinforcement portions 111L, 111R, 112L, 112R, 113L, and 113R that vertically extend from a left edge and a right edge of the supporting portions 111, 112, and 113, respectively.

All components of the frame 100 may be integrated with each other.

In FIG. 10, a boundary between the body 100 and the fence portions 161, 162, and 163 is expressed by a dotted line. A stepped portion may not be defined in the boundary between the body 100 and the fence portions 161, 162, and 163.

In this specification, for convenience of description, a height H of the frame 100 may be defined by a sum of a height H1 of the body 110 and a height H2 of each of the fence portions 161, 162, and 163. Here, the height of the frame 100 may not include a height H3 of each of the leg portions 131, 132, and 133.

Figure 11A:
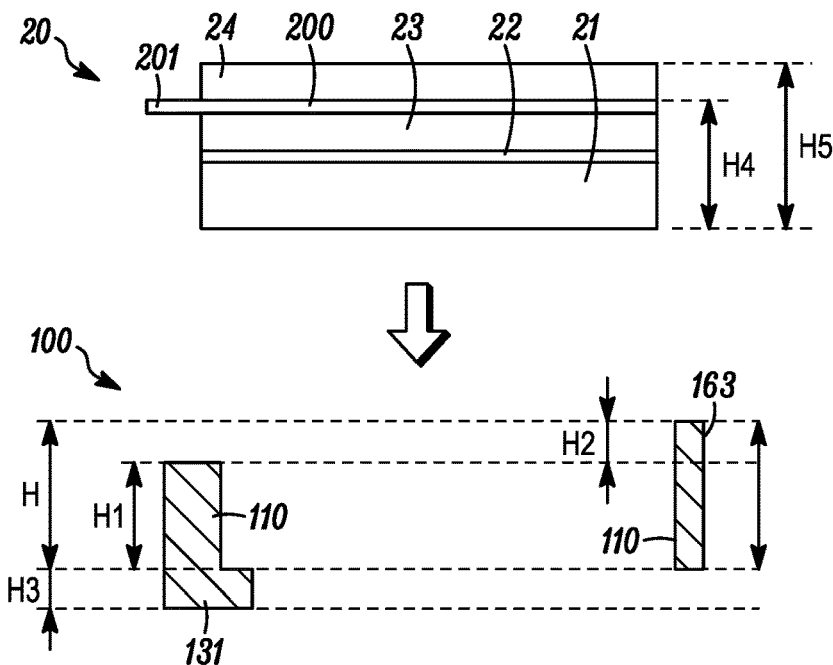
FIG. 11 is a view illustrating a coupling relationship between the frame and the first lamination part in FIG. 6.
Figure 11B:
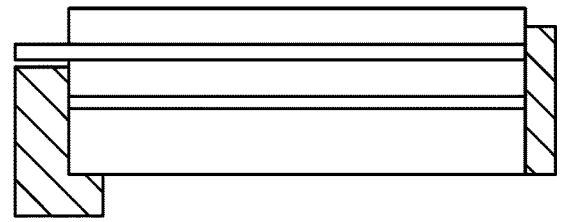
Figure 11C:
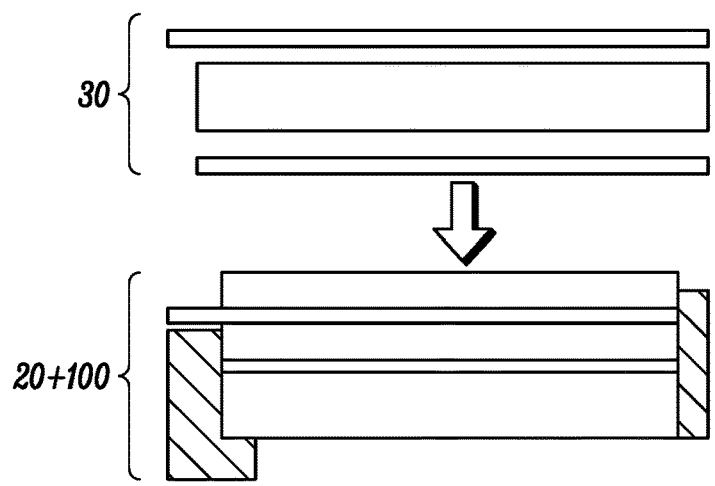

FIG. 11 is a view illustrating a coupling relationship between the frame and the first lamination part in FIG. 6.

Figure (a) of FIG. 11 a view illustrating each of the frame 100 and the first lamination part 20 in detail, figure (b) of FIG. 11 is a view illustrating a state in which the frame 100 and the first lamination part 20 are coupled, and figure (c) of FIG. 11 is a view illustrating a process of coupling the second lamination part 30 in the state in which the frame 100 and the first lamination part 20 are coupled.

Figures in FIG. 11 are cross-sectional views illustrating the frame 100 taken along line A-B in FIG. 10.

The frame 100 may have a height H less than a height H5 of the first lamination part 20. That is, a sum H of a height H1 of the body 110 and a height H2 of the fence portions 161, 162, and 163 may be less than an entire height (=thickness) H5 of the first lamination part 20. That is, a height H of the frame 100 may be less than a sum H5 of heights of the lower permanent magnet 21, the lower pole piece 22, the lower microwave ferrite 23, the center conductor 200, and the upper microwave ferrite 24. Here, the height H of the frame 100 may be greater than a sum H4 of heights of the lower permanent magnet 21, the lower pole piece 22, the lower microwave ferrite 23, and the center conductor 200.

Due to the above-described structure, centers of all internal elements contained in the first lamination part 20 may be aligned with each other by the frame 100. Also, the upper microwave ferrite 24 may have a lower portion, which is accommodated in the frame 100, and an upper portion, which protrudes and exposed from an upper edge of frame 100. Accordingly, when the second lamination part 30 is assembled on the first lamination part 20, the second lamination part 30 may press the first lamination part 20 without being interrupted by the frame 10.

Referring to FIGS. 10 and 11 again, an inner surface of the body 110 and an inner surface of each of fence portions 161, 162, and 163 may substantially correspond to a portion of an inner surface of an imaginary cylinder. Internal elements contained in the first lamination part 20 may be accommodated by the surface of the body 110 and the inner surface of each of fence portions 161, 162, and 163.

The frame 100 may function so that an outer edge of the first lamination part 20 in a radial direction and an inner wall of the housing 600 maintain a gap greater than 0, and the first lamination part 20 is electrically insulated from the housing 600. That is, the frame 100 may function so that an outer edge of each of the lower permanent magnet 21, the lower pole piece 22, the lower microwave ferrite 23, the center conductor 200, and the upper microwave ferrite 24 in a radial direction and the inner wall of the housing 600 maintain a gap greater than 0. To this end, the frame 100 may be made of a non-conductive material.

Also, the frame 100 may function to align the internal elements of the first lamination part 20 with each other. That is, the frame 100 may function to align the lower permanent magnet 21, the lower pole piece 22, the lower microwave ferrite 23, the center conductor 200, and the upper microwave ferrite 24 with each other.

Figure 12A:
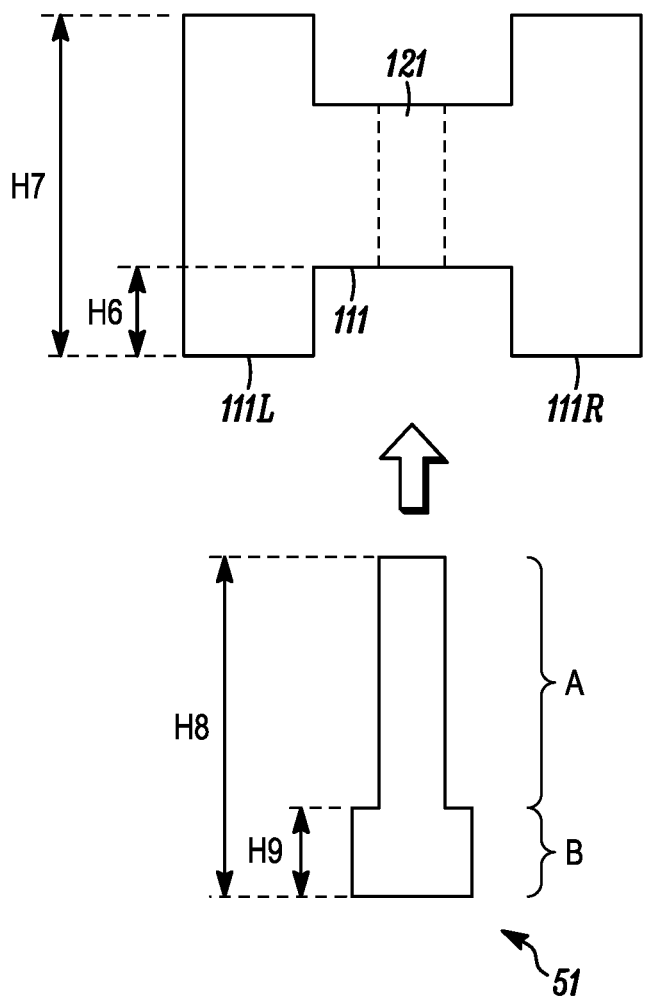
FIG. 12 is a view illustrating a coupling relationship between the conductive pin in FIG. 6 and the through-hole in FIG. 10 and dimensions of shapes of the supporting portion and reinforcement portion of the frame.
Figure 12B:
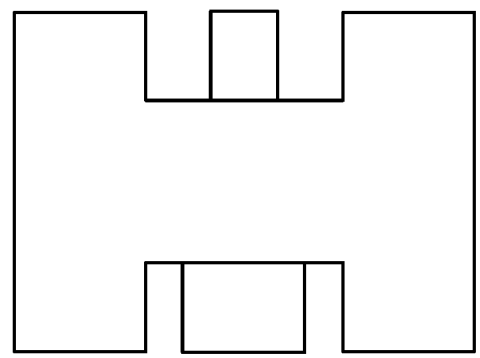

FIG. 12 is a view illustrating a coupling relationship between the conductive pin in FIG. 6 and the through-hole in FIG. 10 and dimensions of shapes of the supporting portion and reinforcement portion of the frame.

In FIG. 12, for convenience of description, only the through-hole 121 of the plurality of through-holes 121, 122, and 123, the conductive pin 51 of the plurality of conductive pins 51, 52, and 53, the reinforcement portion 111L and 111R of the plurality of reinforcement portions 111L, 111R, 112L, 112R, 113L, and 113R, and the supporting portion 111 of the plurality of supporting portions 111, 112, and 113 are illustrated.

The upper figure of figure (a) of FIG. 12 illustrates a state in which a partial area P in FIG. 10 is viewed from an outer side surface with respect to FIG. 6. Here, the partial area P has a 'H'-beam shape.

Figure (b) of FIG. 12 is a view illustrating a state in which the conductive pin 51 in figure (a) of FIG. 12 is coupled to the through-hole 121.

The plurality of conductive pins 51, 52, and 53 may pass through and be coupled to the plurality of through-holes 121, 122, and 123, respectively. Each of the conductive pins 51, 52, and 53 may include a through portion A and a head portion B. The through portion A may have a horizontal cross-section having a shape capable of being inserted to each of the through-holes 121, 122, and 123, and the head portion B may have a horizontal cross-section having a shape preventing the head portion B from passing through the through-hole 121, 122, and 123 when the through portion A passes through each of the through-holes 121, 122, and 123. In an embodiment, each of the horizontal cross-sections of the head portion B and the through portion A may have a circular shape, and the horizontal cross-section of the head portion B may be greater than that of the through portion A.

The conductive pin 51, 52, and 53 may be insertedly coupled to the through hole 121, 122, and 123 in a downward direction from the top or an upward direction from the bottom. Although insertion-coupling in an upward direction from the bottom is exemplarily illustrated in FIG. 6, the present invention is not limited thereto.

Each of the conductive pins may have a length H8 that is substantially the same as a length H7 of each of the reinforcement portions 111L, 111R, 112L, 112R, 113L, and 113R in a vertical direction.

For example, when the head portion B is caught by the supporting portion 111 while the conductive pin 51 is inserted to the through-hole 121, both ends of the conductive pin 51 may be aligned with upper and lower ends of the reinforcement portion 111L and 111R. To this end, a distance H6 between a bottom surface of the reinforcement portion 111L and 111R and a bottom surface of the supporting portion 111 may be the same as a vertical width H9 of the head portion B.

The leads 201, 202, and 203 of the center conductor 200 may be disposed on top surfaces of the plurality of supporting portions 111, 112, and 113, and the leads 201, 202, and 203 may be electrically/physically coupled to upper ends of the corresponding conductive pins 51, 52, and 53, respectively. The above-described coupling may be performed in methods such as heating-compression or soldering.

Figure 13:
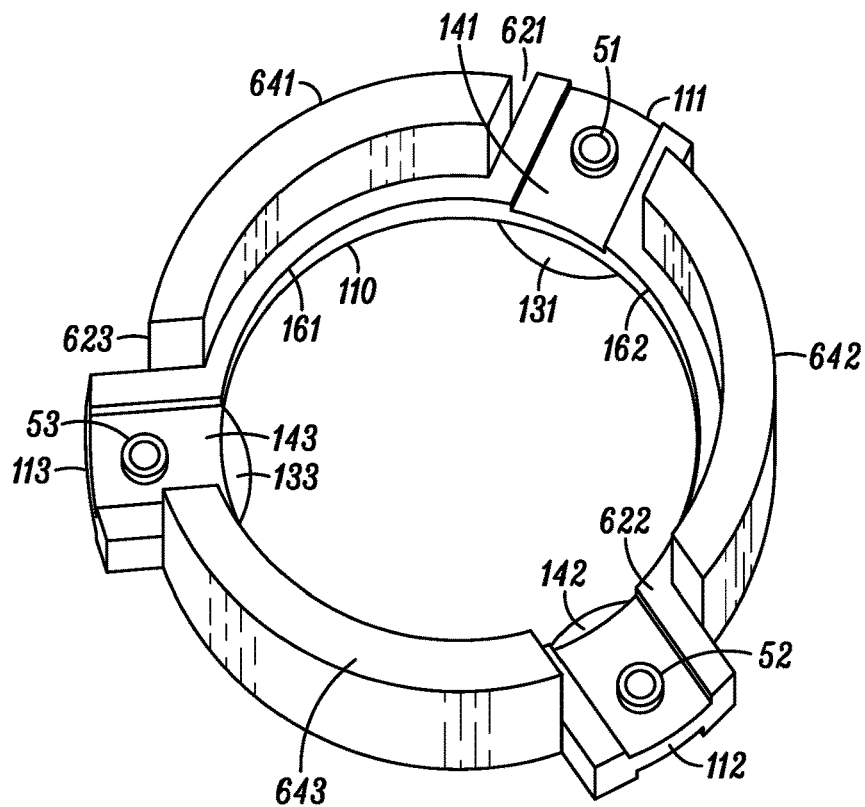
FIG. 13 is a perspective view when a state in which the frame with the conductive pin is insertedly coupled to the housing is viewed from the top in a downward direction.

FIG. 13 is a perspective view when a state in which the frame with the conductive pin coupled is insertedly coupled to the housing is viewed from the top in a downward direction.

The frame 100 may be insertedly coupled to the housing 600. Particularly, as the plurality of leg portions 131, 132, and 133 of the frame 100 are insertedly coupled to the plurality of removed portions 631, 632, and 633 defined in the housing 600, the frame 100 may be coupled to the housing 600. To this end, each of the leg portions 131, 132, and 133 may have a shape corresponding to that of each of the removed portions 631, 632, and 633. For performing the above-described insertion coupling, the housing 600 may be made of rigid metal, and the frame 100 may be made of a synthetic resin.

Figure 14:
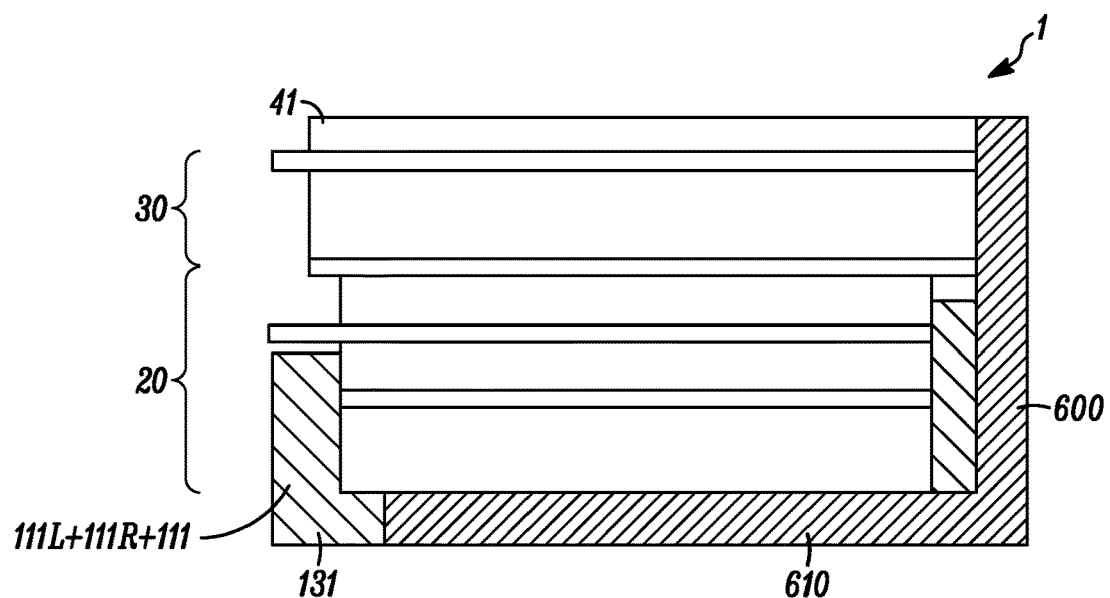
FIG. 14 is a cross-sectional view taken along line A-B in FIG. 10, illustrating the passive microwave device in a state in which the passive microwave device in FIG. 6 is completed.

FIG. 14 is a cross-sectional view taken along line A-B in FIG. 10, illustrating the passive microwave device 1 in a state in which the passive microwave device 1 in FIG. 6 is completed.

In a state in which the frame 100 is insertedly coupled to the housing 600 and the conductive pins 51, 52, and 53 are insertedly coupled to the through-holes 121, 122, and 123, respectively, all of ① a bottom surface of the bottom portion 610 of the housing 600, ② a bottom surface of each of the leg portions 131, 132, and 133, ③ a lower end of each of the reinforcement portions 111L, 111R, 112L, 112R, 113L, and 113R, and ④ a lower end of each of the conductive pins 51, 52, and 53 may be positioned on the same first plane. The above-described components may have suitable dimensions.

Each of the leg portions 131, 132, and 133 may have a vertical width that is the same as a thickness of the bottom portion 610 of the housing 600. Thus, in a state in which the frame 100 is insertedly coupled to the housing 600, all of ① a top surface of the bottom portion 610 of the housing 600, and ② a top surface of each of the leg portions 131, 132, and 133 may be positioned on the same second plane. This may be checked later through figure (c) of FIG. 16.

Figure 15A:
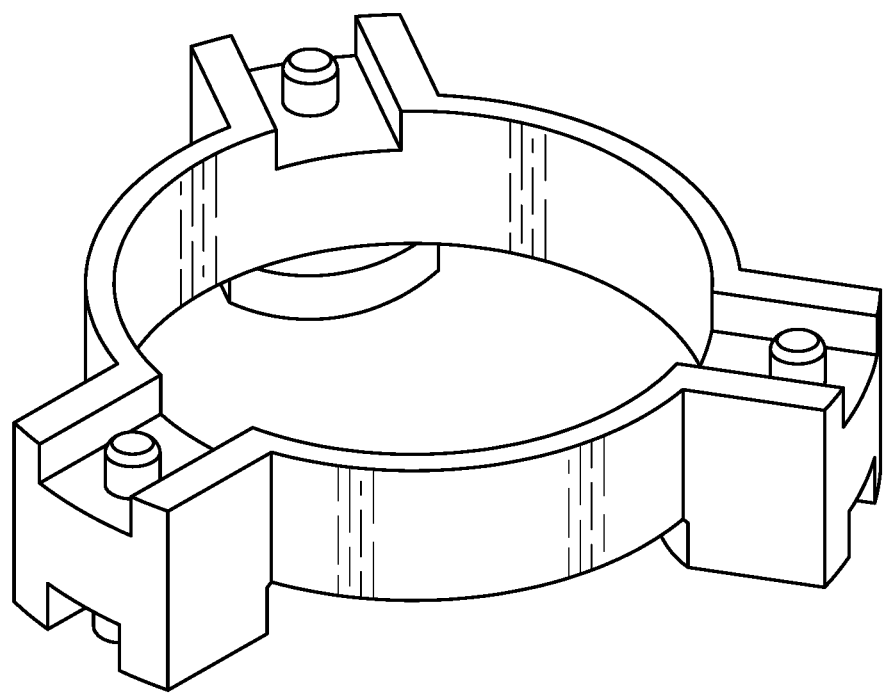
FIG. 15 shows a perspective view illustrating a state in which a coupled body in which the conductive pins are inserted to the frame in FIG. 10 is viewed from the top in a downward direction, and a perspective view illustrating a state in which a coupled body in which the conductive pins are inserted to the frame in FIG. 10 is viewed from the bottom in an upward direction.
Figure 15B:
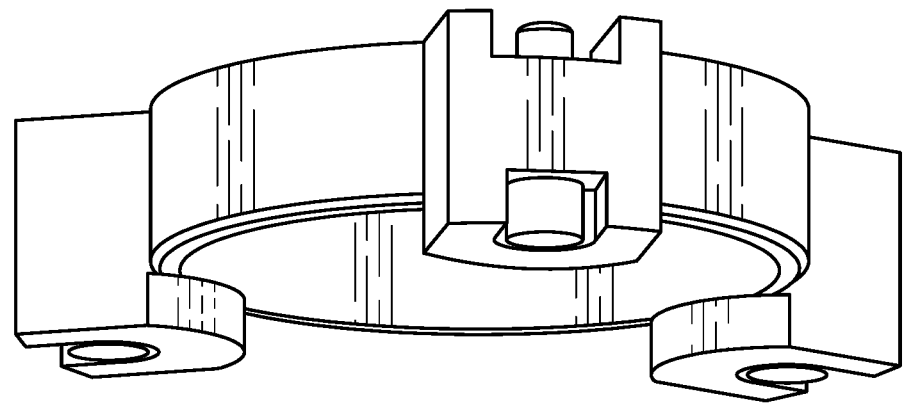

Figure (a) of FIG. 15 is a perspective view illustrating a state in which a coupled body in which the conductive pins are inserted to the frame 100 in FIG. 10 is viewed from the top in a downward direction, and figure (b) of FIG. 15 is a perspective view illustrating a state in which a coupled body in which the conductive pins are inserted to the frame 100 in FIG. 10 is viewed from the bottom in an upward direction.

Figure 16A:
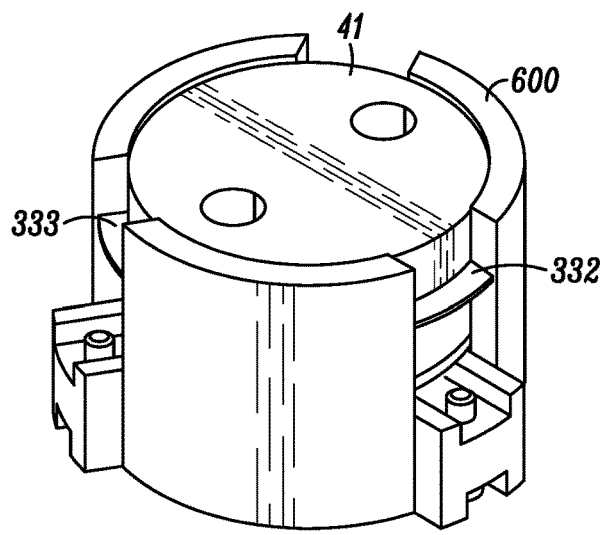
FIG. 16 shows a perspective view illustrating a completed state of the passive microwave device in FIG. 6, a perspective view illustrating a state in which the completed state of the passive microwave device is viewed from the bottom in an upward direction, and a front view illustrating the completed state of the passive microwave device.
Figure 16B:
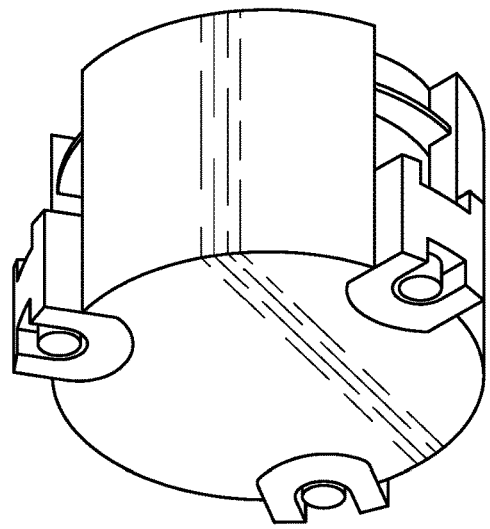
Figure 16C:
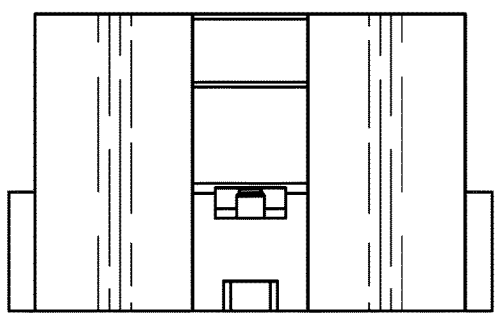
Figure 17A:
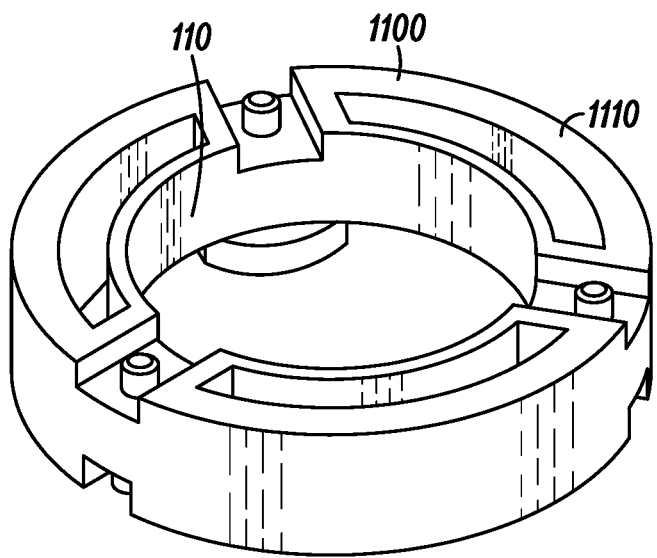
FIG. 17 shows a view illustrating a frame having a shape deformed from that in FIG. 10, a perspective view illustrating a state in which the housing is coupled to the frame, a perspective view illustrating the passive microwave device that is completed by using the frame, and a bottom view illustrating the passive microwave device.
Figure 17B:
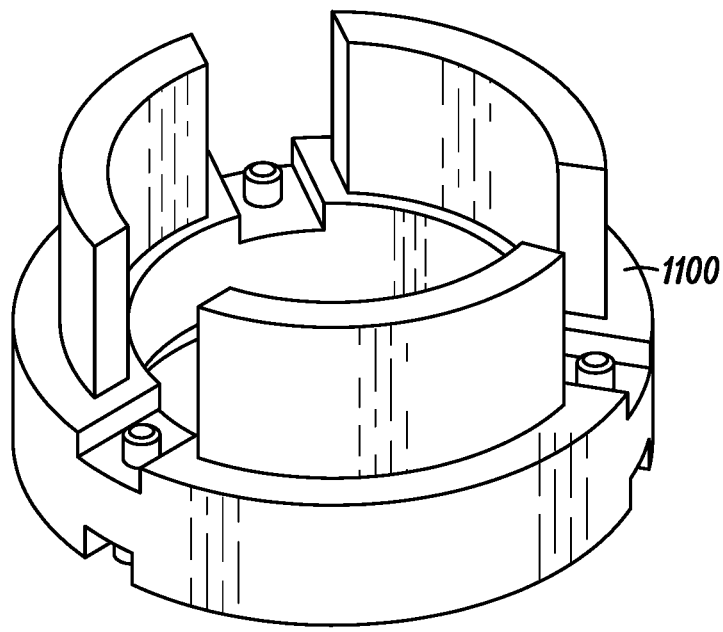
Figure 17C:
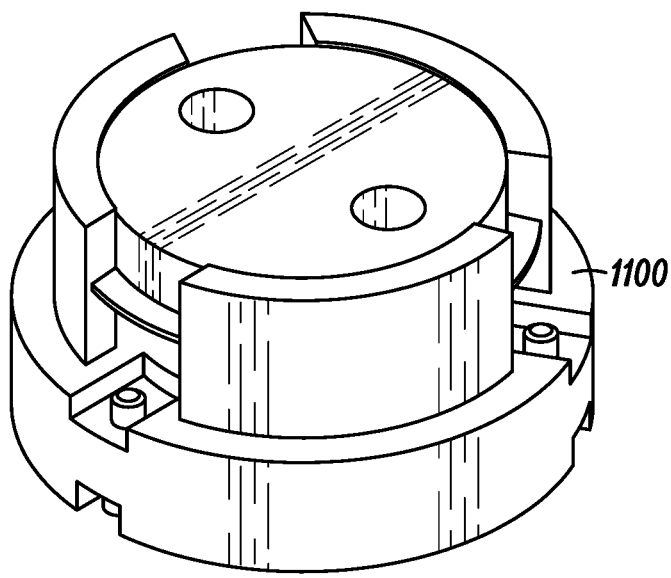
Figure 17D:
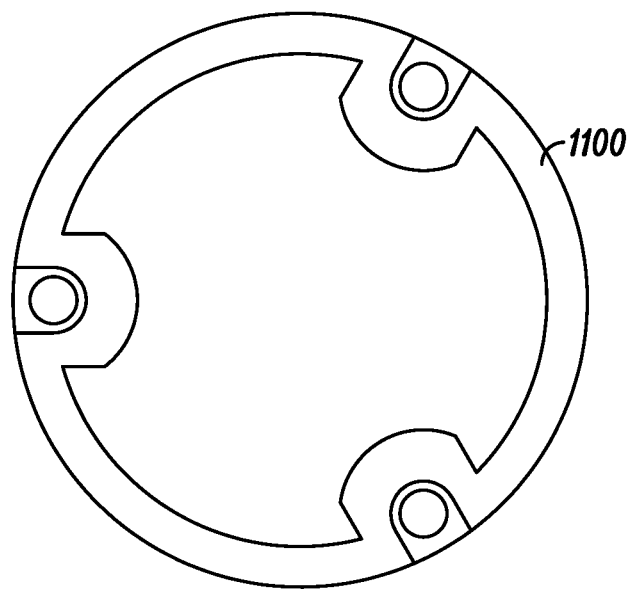

Figure (a) of FIG. 16 is a perspective view illustrating a completed state of the passive microwave device 1 in FIG. 6, figure (b) of FIG. 16 is a perspective view illustrating a state in which the completed state of the passive microwave device 1 is viewed from the bottom in an upward direction, and figure (c) of FIG. 16 is a front view illustrating the completed state of the passive microwave device 1.

Protrusions 331, 332, and 333 corresponding to the removed portions 621, 622, and 623 of the housing may be provided on the stopper 33. When the lid 41 rotates to close the top surface of the housing 600, the protrusions 331, 332, and 333 may prevent elements disposed below the stopper 33 from rotating.

Figure (a) of FIG. 17 is a view illustrating a frame 1100 having a shape deformed from that in FIG. 10. In figure (a) of FIG. 17, conductive pins are coupled to the frame 1100.

When compared with the frame in FIG. 10, the frame 1100 may further include a reinforcement main body 1110 disposed at the outside of a main body 110. The main body 110 and the reinforcement main body 1110 may have ring shapes having the same center as each other. A ring-shaped space having a predetermined width may be defined between the main body 110 and the reinforcement main body 1110. The circumferential side portions 641, 642, and 643 of the housing 600 may be disposed in the ring-shaped space between the main body 110 and the reinforcement main body 1110. As the reinforcement main body 1110 is further provided, the frame 100 made of a synthetic resin may have improved rigidity.

Figure (b) of FIG. 17 is a perspective view illustrating a state in which the housing 600 is coupled to the frame 1110 in figure (a) of FIG. 17.

Figure (c) of FIG. 17 is a perspective view illustrating the passive microwave device 1 that is completed by using the frame 1100 in figure (a) of FIG. 17.

Figure (d) of FIG. 17 is a bottom view illustrating the passive microwave device 1 in figure (c) of FIG. 17.

The passive microwave device 1 according to an embodiment of the present invention may be manufactured in a following sequence.

In a process S10, the conductive pins 51, 52, and 53 may be insertedly coupled to the through-holes 121, 122, and 123, respectively.

In a process S20, the frame 100 may be insertedly coupled to the housing 600.

In a process S30, the lower permanent magnet 21, the lower pole piece 22, the lower microwave ferrite 23, the center conductor 200, and the upper microwave ferrite 24 may be sequentially laminated in the frame 100 and the housing 600. Here, a bottom surface of the lower permanent magnet 21 may contact ① a top surface of the bottom portion 610 of the housing 600, and ② a top surface of each of the leg portions 131, 132, and 133. Also, a bottom surface of the upper microwave ferrite 24 may be disposed at a lower position than an upper edge of the frame 100, and a top surface of the upper microwave ferrite 24 may be disposed at a higher position than the upper edge of the frame 100.

In a process S40, the upper pole piece 31, the upper permanent magnet 32, and the stopper 33 may be sequentially laminated on the upper microwave ferrite 24. Here, at least one of the upper pole piece 31, the upper permanent magnet 32, and the stopper 33 may have a diameter greater than that of the body 110 of the frame 100.

In a process S50, the lid 41 may close an upper portion of the housing 600.

According to the above-described structure of the passive microwave device 1, since all of ① the bottom surface of the bottom portion of the housing 600, ② the bottom surface of each of the leg portions 131, 132, and 133, ③ the lower end of each of the reinforcement portions 111L, 111R, 112L, 112R, 113L, and 113R, and ④ the lower end of each of the conductive pins 51, 52, and 53 are disposed on the same first plane, the passive microwave device 1 may be mounted on another substrate in a SMD-type.

When the frame 100 moves vertically with respect to the housing 600, the leads 201, 202, and 203 of the center conductor 200, which are electrically/physically connected to the upper end of each of the conductive pins 51, 52, and 53 may move together on the supporting portions 111, 112, and 113 of the frame 100. In this case, as the leads 201, 202, and 203 are deformed in shape, operation characteristics of the passive microwave device 1 are changed. Thus, the passive microwave device 1 is degraded in reliability. According to the present invention, since the frame 100 is insertedly coupled to the housing 600, the frame 100 may not move vertically with respect to the housing 600, and thus the degradation in reliability may be prevented.

Figure 18A:
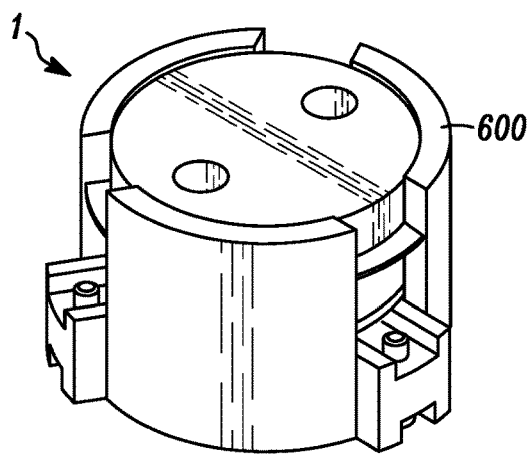
FIG. 18 shows a perspective view illustrating the passive microwave device according to an embodiment of the present invention, an exploded perspective view illustrating the passive microwave device according to an embodiment of the present invention, and an exploded front view illustrating the passive microwave device according to an embodiment of the present invention.
Figure 18B:
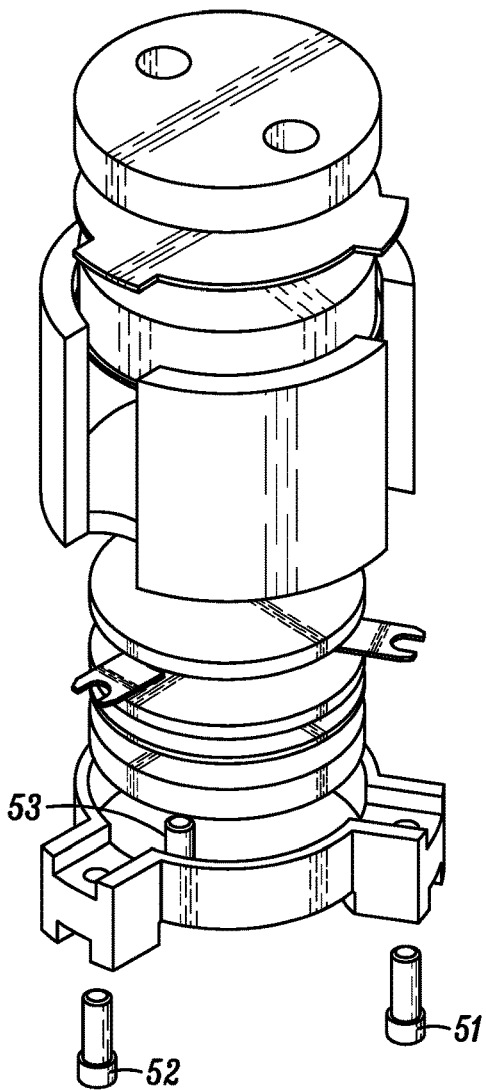
Figure 18C:
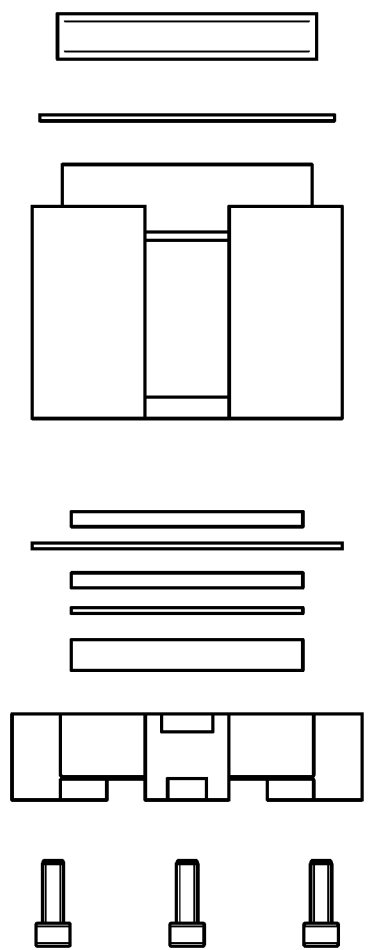

Figure (a) of FIG. 18 is a perspective view illustrating the passive microwave device according to an embodiment of the present invention, figure (b) of FIG. 18 is an exploded perspective view illustrating the passive microwave device according to an embodiment of the present invention, and figure (c) of FIG. 18 is an exploded front view illustrating the passive microwave device according to an embodiment of the present invention.

Figure 19A:
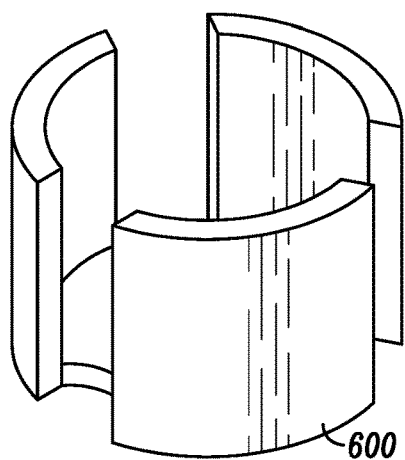
FIG. 19 shows a perspective view illustrating the housing according to an embodiment of the present invention, a plan view illustrating the housing according to an embodiment of the present invention, and a bottom view illustrating the housing according to an embodiment of the present invention.
Figure 19B:
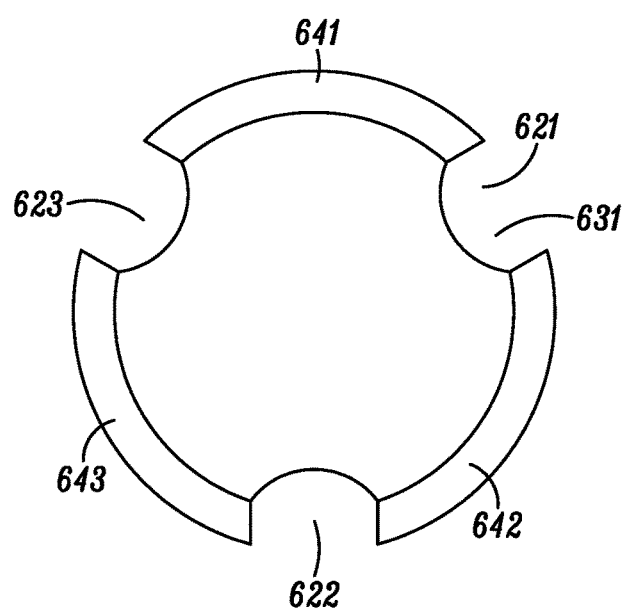
Figure 19C:
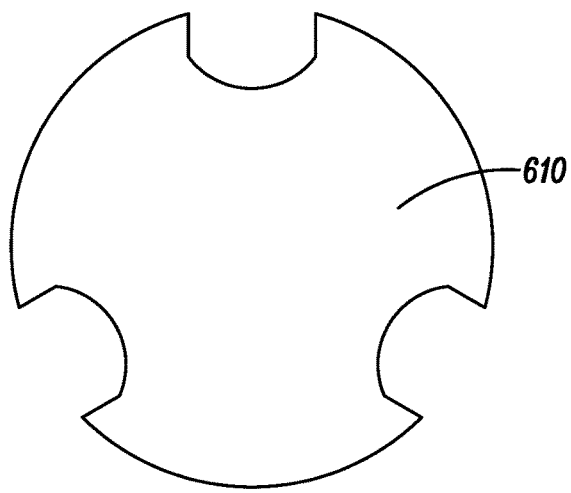
Figure 20A:
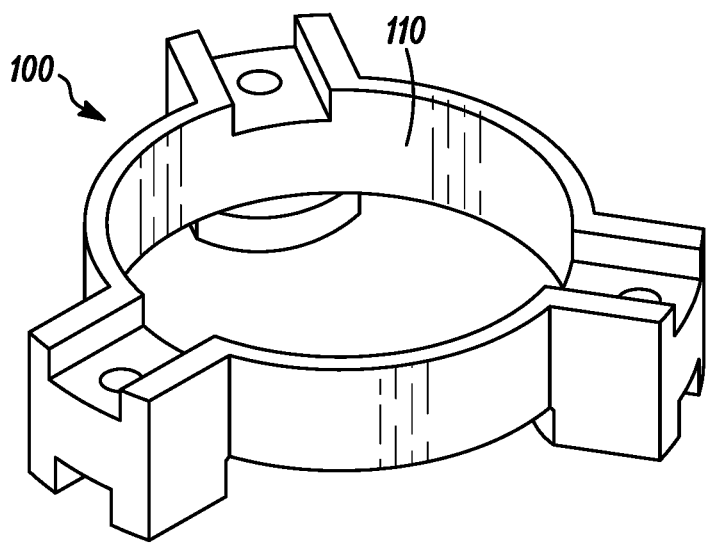
FIG. 20 shows a perspective view illustrating the frame according to an embodiment of the present invention, a plan view illustrating the frame according to an embodiment of the present invention, a bottom view illustrating the frame according to an embodiment of the present invention, and a side view illustrating a frame according to an embodiment of the present invention.
Figure 20B:
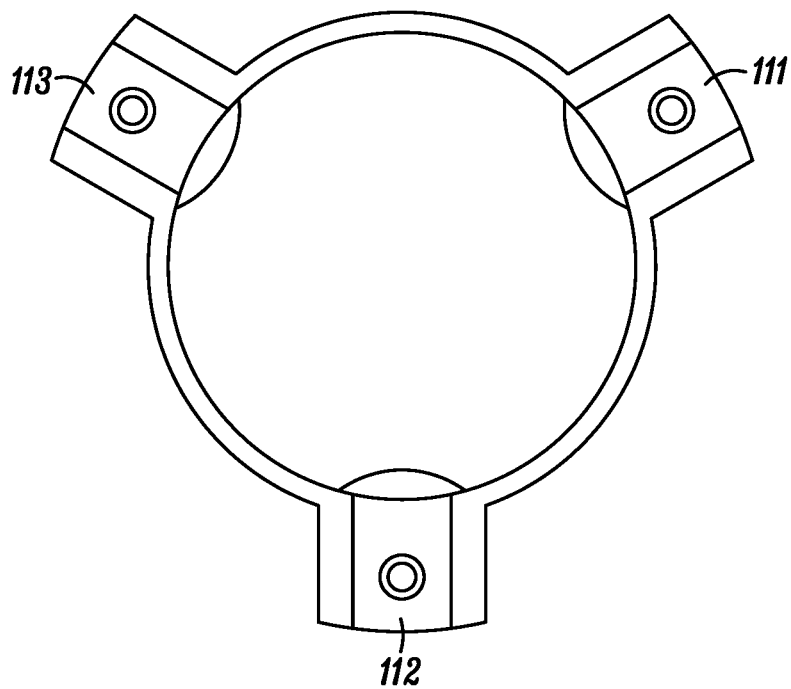
Figure 20C:
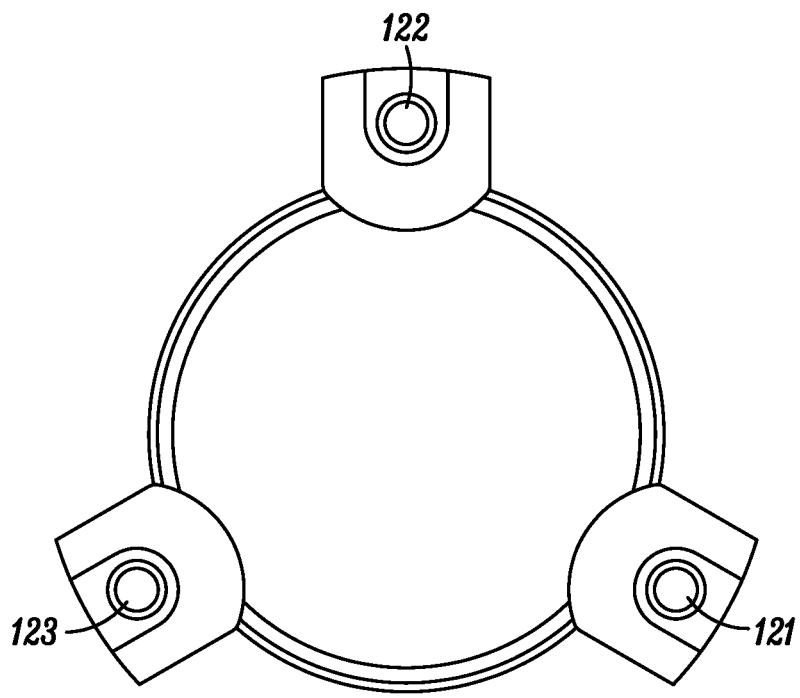
Figure 20D:
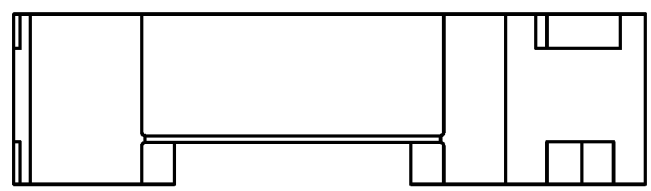

Figure (a) of FIG. 19 is a perspective view illustrating the housing according to an embodiment of the present invention, figure (b) of FIG. 19 is a plan view illustrating the housing according to an embodiment of the present invention, and figure (c) of FIG. 19 is a bottom view illustrating the housing according to an embodiment of the present invention.

Figure (a) of FIG. 20 is a perspective view illustrating the frame according to an embodiment of the present invention, figure (b) of FIG. 20 is a plan view illustrating the frame according to an embodiment of the present invention, figure (c) of FIG. 20 is a bottom view illustrating the frame according to an embodiment of the present invention, and figure (d) of FIG. 20 is a side view illustrating a frame according to an embodiment of the present invention.

Figure 21:
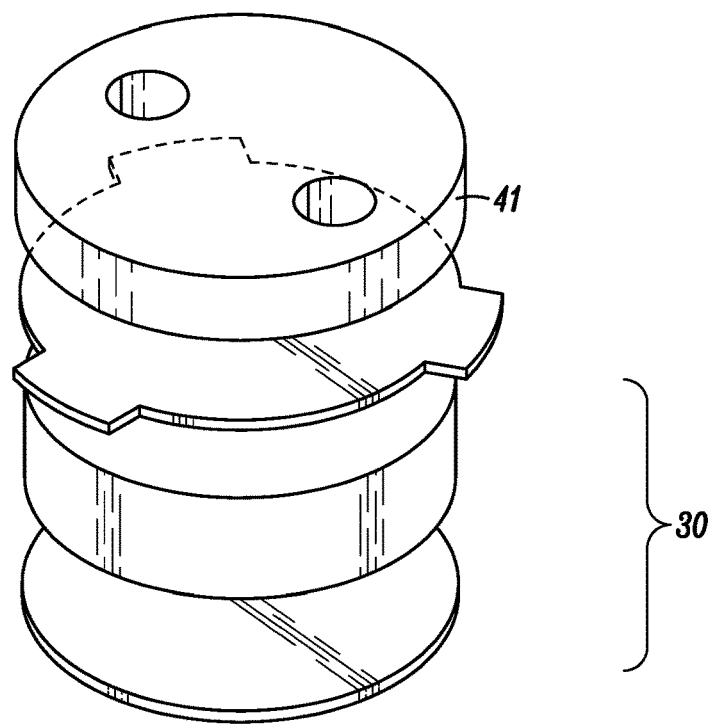
FIG. 21 is an exploded front view the first lamination part, the second lamination part, and the lid according to an embodiment of the present invention.
Figure 21:
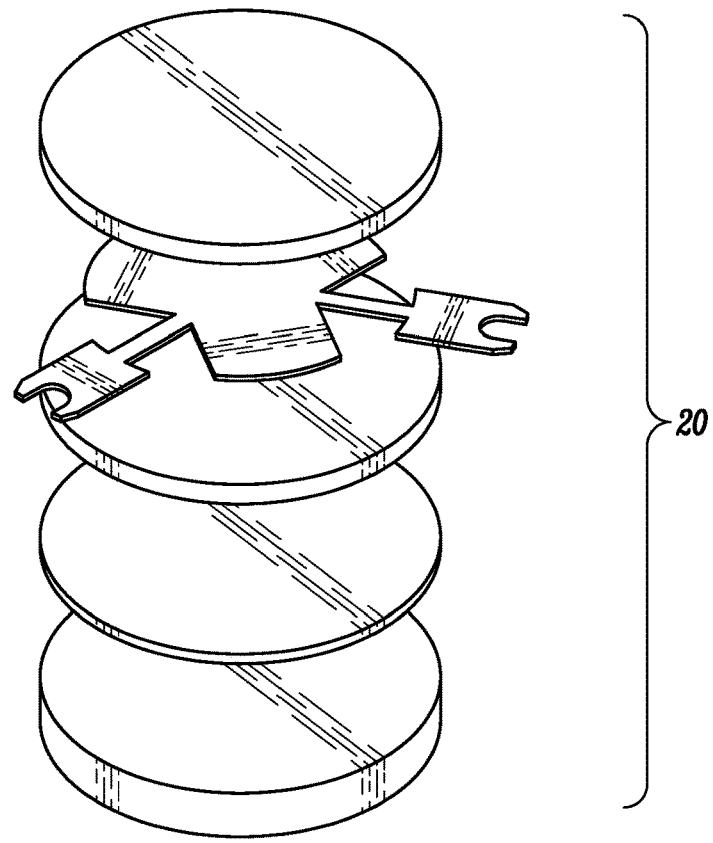

FIG. 21 is an exploded front view the first lamination part, the second lamination part, and the lid according to an embodiment of the present invention.

Figure 22A:
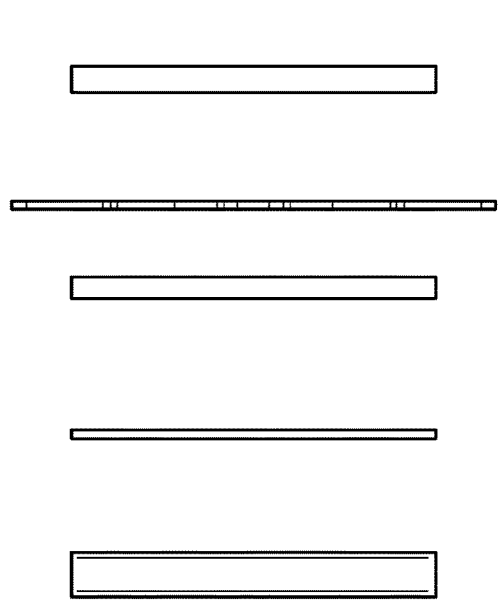
FIG. 22 shows an exploded front view illustrating the first lamination part according to an embodiment of the present invention, and an exploded perspective view illustrating the first lamination part according to an embodiment of the present invention.
Figure 22B:
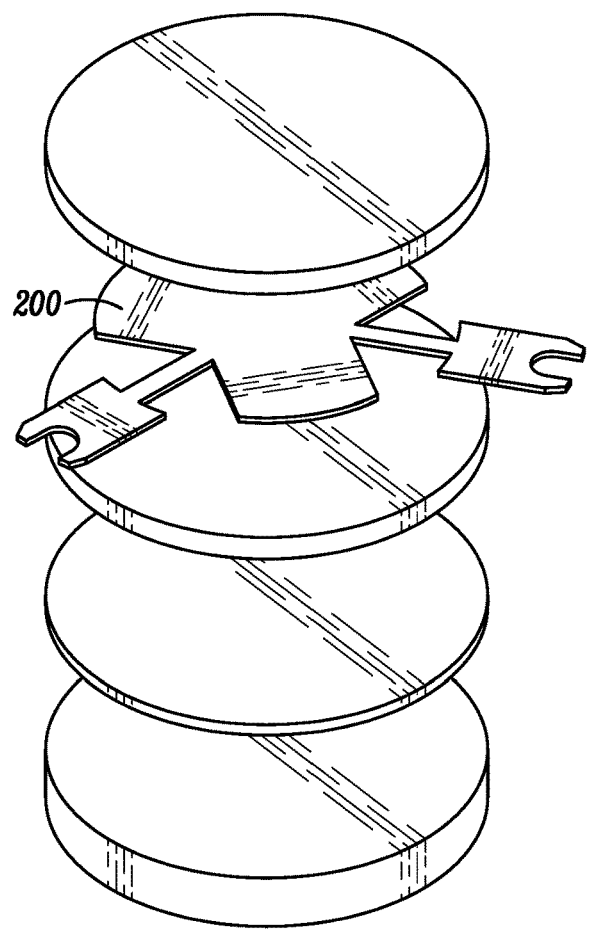

Figure (a) of FIG. 22 is an exploded front view illustrating the first lamination part according to an embodiment of the present invention, and figure (b) of FIG. 22 is an exploded perspective view illustrating the first lamination part according to an embodiment of the present invention.

Figure 23A:
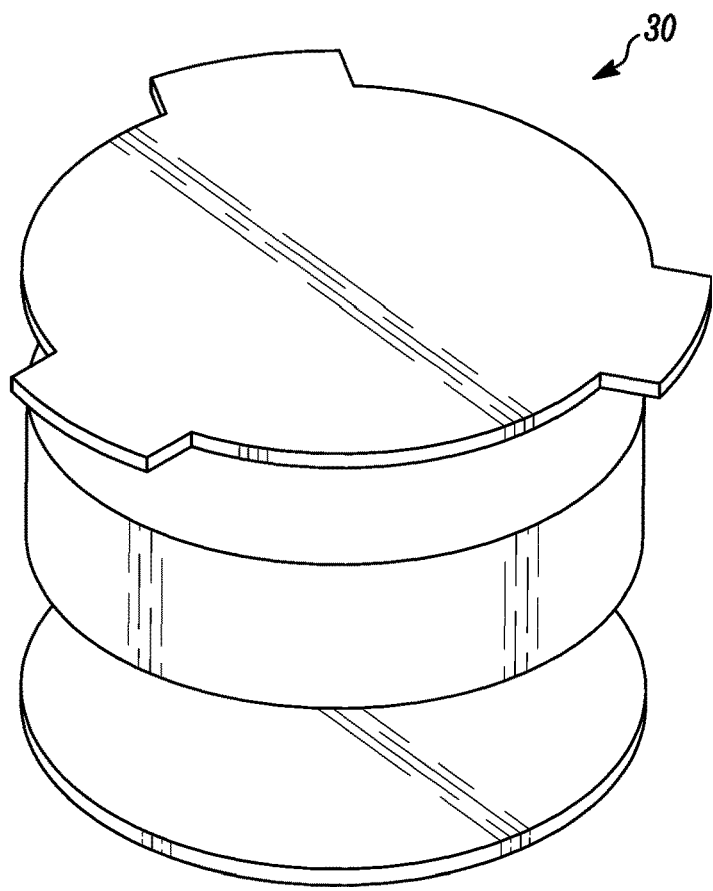
FIG. 23 shows an exploded perspective view illustrating the second lamination part according to an embodiment of the present invention, and an exploded front view illustrating the second lamination part according to an embodiment of the present invention.
Figure 23B:
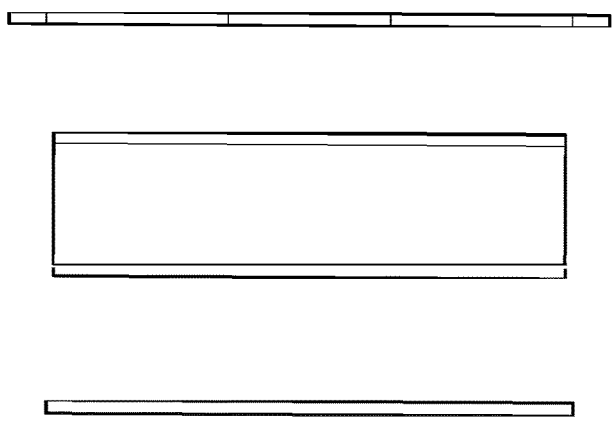

Figure (a) of FIG. 23 is an exploded perspective view illustrating the second lamination part according to an embodiment of the present invention, and figure (b) of FIG. 23 is an exploded front view illustrating the second lamination part according to an embodiment of the present invention.

Figure 24A:
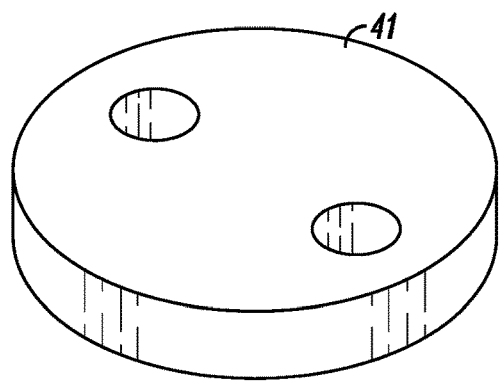
FIG. 24 shows a perspective view illustrating the lid according to an embodiment of the present invention, a plan view illustrating the stopper according to an embodiment of the present invention, and a plan view illustrating the center conductor according to an embodiment of the present invention.
Figure 24B:
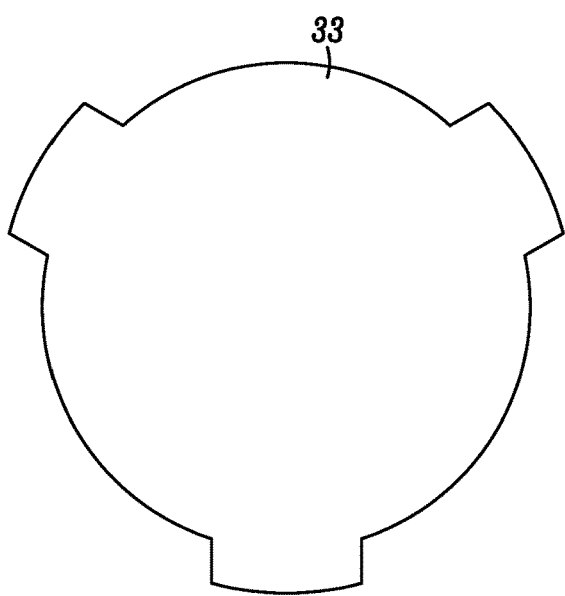
Figure 24C:
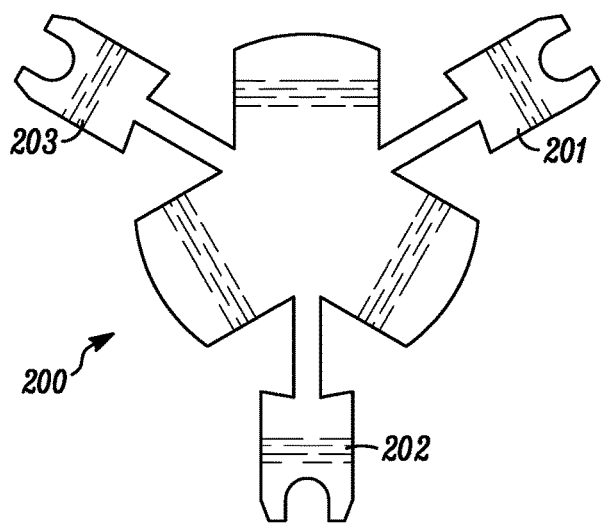

Figure (a) of FIG. 24 is a perspective view illustrating the lid according to an embodiment of the present invention, figure (b) of FIG. 24 is a plan view illustrating the stopper according to an embodiment of the present invention, and figure (b) of FIG. 24 is a plan view illustrating the center conductor according to an embodiment of the present invention.

According to the above-described structure of the passive microwave device 1, in order to mount the leads 201, 202, and 203 of the center conductor 200 on another substrate in a SMD method, only the frame 100 and the conductive pins 51, 52, and 53 are necessary to be provided. This structure is an extremely simple structure in comparison with a related art, and since the frame 100 is manufactured by using a synthetic resin, manufacturing costs may be remarkably reduced.

Also, according to the above-described structure of the passive microwave device 1, since the supporting portions 111, 112, and 113 and the reinforcement portions 111L, 111R, 112L, 112R, 113L, and 113R form a H-type frame, in a process of applying a force for the insertion coupling between the conductive pins 51, 52, and 53 and the through-holes 121, 122, and 123, rigidity for preventing the supporting portions 111, 112, and 113 from being broken or deformed may be secured.

In a deformed embodiment of the present invention, the lower pole piece 22, the lower microwave ferrite 23, the center conductor 200, the upper microwave ferrite 24, the upper pole piece 31, the upper permanent magnet 32, the stopper 33, and the lid 41 may be sequentially laminated from the bottom portion 610 of the housing 600. In this case, the first lamination part 20 may include the lower pole piece 22, the lower microwave ferrite 23, the center conductor 200, and the upper microwave ferrite 24. Also, the second lamination part 30 may include the upper pole piece 31, the upper permanent magnet 32, and the stopper 33.

The lower microwave ferrite and the upper microwave ferrite may be referred to as the lower microwave disc and the upper microwave disc, respectively.

Preferably, the number of the leads, the number of the circumferential side portions, the number of the openings, the number of the removed portions, the number of the accommodation spaces, the number of the fence portions, the number of the supporting portions, the number of the through-holes, and the number of the leg portions may be three. However, in a deformed embodiment, the number of each of the removed portions and the leg portions may be one or two.

It will be apparent to those skilled in the art that various modifications and variations may be made in the present invention without departing from the spirit or essential characteristics thereof. The contents of each claim may be combined with other claims without departing from the scope of the claims.

What is claimed is:

1. A reciprocal element comprising:
a housing (600) comprising a plurality of circumferential side portions (641, 642, 643), which are distinguished by a plurality of openings (621, 622, 623), and a bottom portion (610) in which at least one removed portion (631) is defined;
a first lamination part (20) comprising a center conductor (200) comprising a plurality of leads (201, 202, 203) extending to the outside of the plurality of openings, respectively, wherein the first lamination part (20) is laminated on the bottom portion;
a frame (100) comprising a main body (110) configured to accommodate the first lamination part, at least one leg portion (131) extending from a lower edge of the main body (110) and insertedly coupled to the at least one removed portion, and a plurality of supporting portions (111, 112, 113) extending in an outer direction from the main body in order to support the plurality of leads, wherein through-holes (121, 122, 123) extending in a vertical direction and defined in the plurality of supporting portions, respectively; and
a plurality of conductive pins (51, 52, 53) coupled to the plurality of through-holes, respectively.

2. The reciprocal element of claim 1, wherein a lower end of each of the plurality of conductive pins and a bottom surface of the bottom portion are substantially disposed on a first plane.

3. The reciprocal element of claim 1, wherein an internal element disposed at an uppermost portion of the first lamination part has an upper side, in which a portion protrudes upward from an upper edge of the frame, and a lower side, in which a portion downward from an upper edge of the frame is accommodated by the frame.

4. The reciprocal element of claim 1, wherein a lower end of each of the plurality of conductive pins and a bottom surface of the bottom portion are substantially disposed on a first plane,
a bottom surface of the leg portion is substantially disposed on the first plane,
a thickness between the bottom and top surfaces of the leg portion is the same as that of the bottom portion, and
a bottom surface of the first lamination part contacts all of a top surface of the bottom portion and a top surface of the leg portion.

5. The frame of claim 1, wherein the frame has a dimension such that an internal element disposed at an uppermost portion of the first lamination part has an upper side, in which a portion protrudes upward from an upper edge of the frame, and a lower side, in which a portion downward from an upper edge of the frame is accommodated by the frame.

6. The reciprocal element of claim 1, wherein each of the plurality of supporting portion comprises:
a left reinforcement portion extending in a vertical direction and disposed at a left side of the supporting portion; and
a right reinforcement portion extending in a vertical direction and disposed at a right side of the supporting portion, and
in each of the plurality of supporting portions, the supporting portion, the left reinforcement portion, and the right reinforcement portion have a H-beam shaped structure.

7. The reciprocal element of claim 6, wherein a lower end of each of the plurality of conductive pins and a bottom surface of the bottom portion are disposed on a first plane, and
the left reinforcement portion and the right reinforcement portion are substantially disposed on the first plane.

8. A frame for a reciprocal element comprising: a housing (600) comprising a plurality of circumferential side portions (641, 642, 643), which are distinguished by a plurality of openings (621, 622, 623), and a bottom portion (610) in which at least one removed portion (631) is defined; and a first lamination part (20) comprising a center conductor (200) comprising a plurality of leads (201, 202, 203) extending to the outside of the plurality of openings, respectively, wherein the first lamination part (20) is laminated on the bottom portion, the frame comprising:
a main body (110) configured to accommodate the first lamination part;
at least one leg portion (131) extending from a lower edge of the main body (110) and insertedly coupled to the at least one removed portion; and
a plurality of supporting portions (111, 112, 113) extending outward from the main body in order to support the plurality of leads,
wherein through-holes (121, 122, 123) extending in a vertical direction are defined in the plurality of supporting portions, respectively, and a plurality of conductive pins (51, 52, 53) are insertedly coupled to the through-holes, respectively.

9. The frame of claim 8, wherein the frame has a dimension such that a lower end of each of the plurality of conductive pins and a bottom surface of the bottom portion are substantially disposed on a first plane.

10. The frame of claim 8, wherein a lower end of each of the plurality of conductive pins and a bottom surface of the bottom portion are substantially disposed on a first plane, a bottom surface of the leg portion is substantially disposed on the first plane, a thickness between the bottom and top surfaces of the leg portion is the same as that of the bottom portion, and a bottom surface of the first lamination part contacts all of a top surface of the bottom portion and a top surface of the leg portion.

11. The frame of claim 8, wherein each of the plurality of supporting portion comprises:

a left reinforcement portion extending in a vertical direction and disposed at a left side of the supporting portion; and a right reinforcement portion extending in a vertical direction and disposed at a right side of the supporting portion, and in each of the plurality of supporting portions, the supporting portion, the left reinforcement portion, and the right reinforcement portion have a H-beam shaped structure.

12. The frame of claim 11, wherein the frame has a dimension such that a lower end of each of the plurality of conductive pins and a bottom surface of the bottom portion are disposed on a first plane, and the left reinforcement portion and the right reinforcement portion are substantially disposed on the first plane.

\* \* \* \* \*